(12) United States Patent
Huang et al.

(10) Patent No.: US 11,552,087 B2
(45) Date of Patent: Jan. 10, 2023

(54) STRAP-CELL ARCHITECTURE FOR EMBEDDED MEMORY

(71) Applicant: Taiwan Semiconductor Manufacturing Co., Ltd., Hsin-Chu (TW)

(72) Inventors: Wen-Tuo Huang, Tainan (TW); Ping-Cheng Li, Kaohsiung (TW); Hung-Ling Shih, Tainan (TW); Po-Wei Liu, Tainan (TW); Yu-Ling Hsu, Tainan (TW); Yong-Shiuan Tsair, Tainan (TW); Chia-Sheng Lin, Tainan (TW); Shih Kuang Yang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 87 days.

(21) Appl. No.: 17/190,678

(22) Filed: Mar. 3, 2021

(65) Prior Publication Data

US 2021/0183875 A1 Jun. 17, 2021

Related U.S. Application Data

(62) Division of application No. 16/364,405, filed on Mar. 26, 2019, now Pat. No. 10,943,913.

(Continued)

(51) Int. Cl.
*H01L 27/11521* (2017.01)
*H01L 23/528* (2006.01)
(Continued)

(52) U.S. Cl.
CPC ......... *H01L 27/11521* (2013.01); *H01L 21/76802* (2013.01); *H01L 21/76877* (2013.01);
(Continued)

(58) Field of Classification Search
CPC combination set(s) only.
See application file for complete search history.

(56) References Cited

U.S. PATENT DOCUMENTS 7,061,801 B1 * 6/2006 Wong ............... H01L 27/11568
365/185.11
7,495,958 B2 2/2009 Chih
(Continued)

OTHER PUBLICATIONS

Notice of Allowance dated Oct. 30, 2020 for U.S. Appl. No. 16/364,405.

*Primary Examiner* — Ratisha Mehta
(74) *Attorney, Agent, or Firm* — Eschweiler & Potashnik, LLC

(57) ABSTRACT

Various embodiments of the present application are directed towards an integrated memory chip comprising a memory array with a strap-cell architecture that reduces the number of distinct strap-cell types and that reduces strap-line density. In some embodiments, the memory array is limited to three distinct types of strap cells: a source line/erase gate (SLEG) strap cell; a control gate/word line (CGWL) strap cell; and a word-line strap cell. The small number of distinct strap-cell types simplifies design of the memory array and further simplifies design of a corresponding interconnect structure. Further, in some embodiments, the three distinct strap-cell types electrically couple word lines, erase gates, and control gates to corresponding strap lines in different metallization layers of an interconnect structure. By spreading the strap lines amongst different metallization layers, strap-line density is reduced.

20 Claims, 22 Drawing Sheets

Related U.S. Application Data

(60) Provisional application No. 62/737,274, filed on Sep. 27, 2018.

(51) Int. Cl.
| | |
|---|---|
| *H01L 23/532* | (2006.01) |
| *H01L 29/49* | (2006.01) |
| *H01L 29/423* | (2006.01) |
| *H01L 29/66* | (2006.01) |
| *H01L 29/40* | (2006.01) |
| *H01L 21/768* | (2006.01) |
| *H01L 23/522* | (2006.01) |
| *H01L 29/788* | (2006.01) |
| *H01L 21/28* | (2006.01) |

(52) U.S. Cl.
CPC ........ *H01L 23/528* (2013.01); *H01L 23/5226* (2013.01); *H01L 23/53271* (2013.01); *H01L 29/401* (2013.01); *H01L 29/40114* (2019.08); *H01L 29/42328* (2013.01); *H01L 29/4916* (2013.01); *H01L 29/66825* (2013.01); *H01L 29/788* (2013.01)

(56) References Cited

U.S. PATENT DOCUMENTS

| | | | |
|---|---|---|---|
| 2005/0285207 A1 | 12/2005 | Kim | |
| 2015/0213898 A1* | 7/2015 | Do | ................ G11C 5/063 |
| | | | 257/316 |
| 2016/0133639 A1 | 5/2016 | Tran et al. | |
| 2017/0032835 A1 | 2/2017 | Liaw | |

* cited by examiner

STRAP-CELL ARCHITECTURE FOR EMBEDDED MEMORY

REFERENCE TO RELATED APPLICATIONS

This Application is a Divisional of U.S. application Ser. No. 16/364,405, filed on Mar. 26, 2019, which claims the benefit of U.S. Provisional Application No. 62/737,274, filed on Sep. 27, 2018. The contents of the above-referenced Patent Applications are hereby incorporated by reference in their entirety.

BACKGROUND

Embedded flash is flash memory that is integrated with logic devices on a common integrated circuit (IC) chip. The integration improves performance by eliminating interconnect structures between chips and reduces manufacturing costs by sharing process steps between the flash memory and the logic devices. Some types of flash memory include stacked gate flash memory and split gate flash memory. Split gate flash memory has lower power consumption, higher injection efficiency, less susceptibility to short channel effects, and over erase immunity compared to stacked gate flash memory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
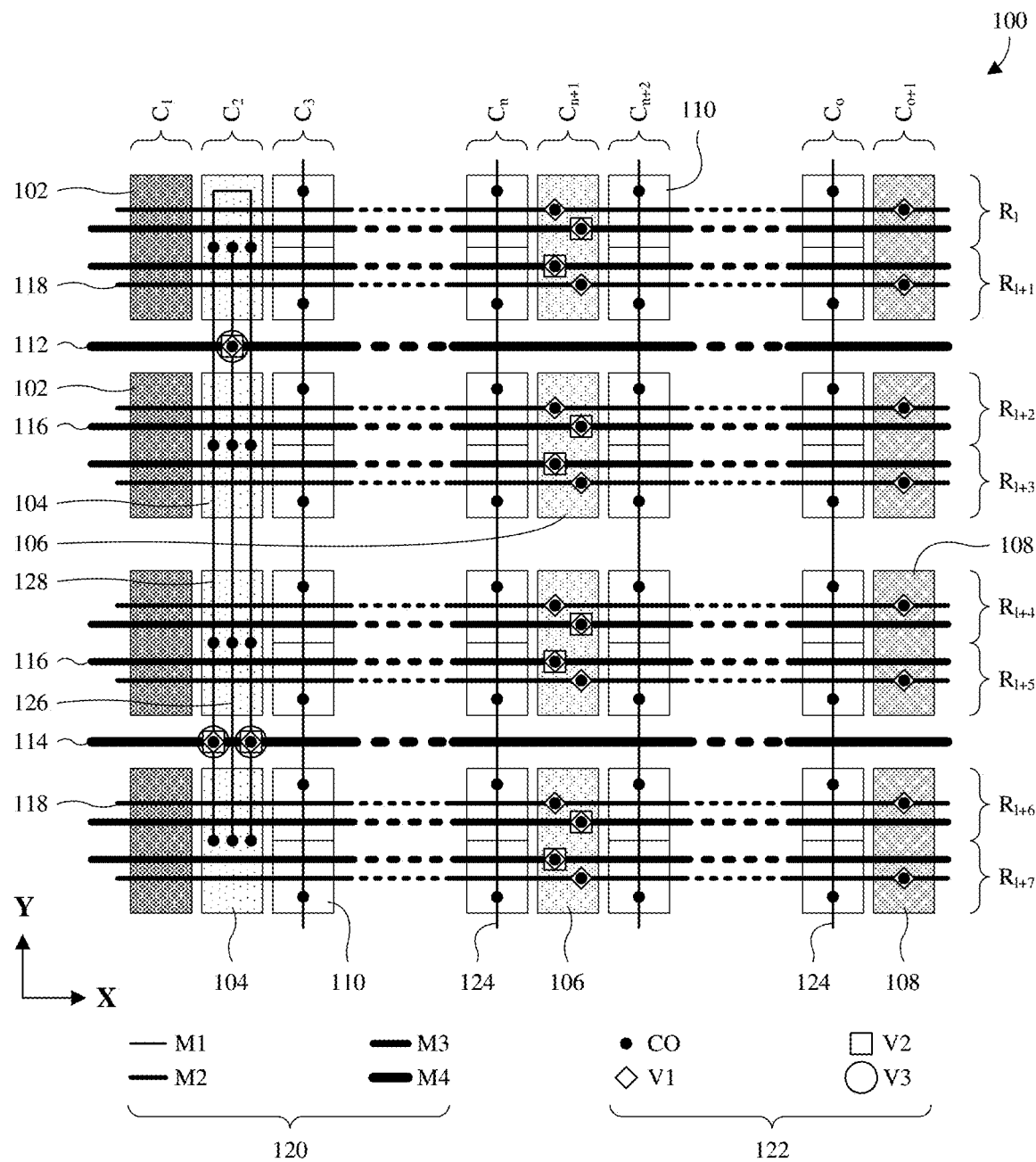
FIG. 1 illustrates a schematic diagram of some embodiments of an integrated chip comprising a memory array with an enhanced strap-cell architecture and further comprising an interconnect structure corresponding to the enhanced strap-cell architecture.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a memory array comprises multiple split-gate memory cells in multiple rows and multiple columns, and further comprises multiple polysilicon lines and multiple buried lines extending along the rows. The polysilicon and buried lines partially define the split-gate memory cells and facilitate reading from and/or writing to the split-gate memory cells. The polysilicon lines may, for example, correspond to control gates, word lines, and erase gates, and the buried lines may, for example, correspond to source lines. A challenge is that that the polysilicon and buried lines have high resistances that lead to large voltage drops along the polysilicon and buried lines. Such large voltage drops increase minimum read and/or write voltage and hence reduce power efficiency. A solution is to strap metal lines to the polysilicon and buried lines since the metal lines have lower resistances. Hence, some embodiments of the memory array comprise strap cells spaced along the polysilicon and buried lines for use as locations to electrically couple the metal lines to the polysilicon and buried lines.

In some embodiments, the memory array comprises four distinct types of strap cells: a control gate/source line (CGSL) strap cell; a source line (SL) strap cell; a word line/erase gate (WLEG) strap cell; and an erase gate (EG) strap cell. However, the large number of distinct types of strap cells leads to complexity when designing the memory array. Additionally, in some embodiments, the metal lines for the word lines, the erase gates, and the control gates are in a single metallization layer (e.g., metal 3) of an interconnect structure. However, arranging the metal lines for the word lines, the erase gates, and the control gates in a single metallization layer may pose challenges as the memory array shrinks (e.g., to process node 40 and beyond). For example, as the memory array shrinks, extreme low k (ELK) dielectric materials may be used for inter-metal and/or inter-layer dielectric layers of the interconnect structure. However, ELK dielectric materials tend to have high porosity and hence low time dependent dielectric breakdowns (TDDBs) compared to their non-porous counterparts with higher dielectric constants. Due to the low TDDBs, the minimum spacing between metal lines is higher than when using the non-porous counterparts. Further, due to the large number of metal lines in a single metallization layer, meaningful scaling of the memory array is precluded without violating the minimum spacing constraint. To violate this constraint potentially leads to device failure and/or a high amount of leakage current between metal lines.

Various embodiments of the present application are directed towards an integrated memory chip comprising a memory array with a strap-cell architecture that reduces the number of distinct strap-cell types and that reduces strap-line density. In some embodiments, the memory array is limited to three distinct types of strap cells: a source line/erase gate (SLEG) strap cell; a control gate/word line (CGWL) strap cell; and a word-line strap cell. The small number of distinct strap-cell types simplifies design of the memory array and further simplifies design of a corresponding interconnect structure.

The three distinct strap-cell types may, for example, electrically couple word lines, erase gates, and control gates to corresponding strap lines in different metallization layers of an interconnect structure. For example, the word lines may be electrically coupled to word-line strap lines in metal 2, the control gates may be electrically coupled to control-gate strap lines in metal 3, and the erase gates may be electrically coupled to erase-gate strap lines in metal 4. Other suitable metallization layers are, however, amenable for the word-line strap lines, the control-gate strap lines, and the erase-gate strap lines. By spreading the word-line strap lines, the control-gate strap lines, and the erase-gate strap lines amongst different metallization layers, strap-line density is reduced (i.e., strap-line spacing is increased). This allows enhanced scaling of the memory array (e.g., to process node 40 and beyond) and/or allows use of ELK dielectric materials for inter-layer and/or inter-metal dielectric layers of the interconnect structure.

The three distinct strap-cell types may, for example, be laid out to provide electrical coupling to corresponding strap lines at frequencies that minimize read and/or write voltage drops and/or that match strap-cell architectures with four or more distinct strap-cell types (an example of which is noted above). For example, SLEG strap cells may electrically couple a source line to a corresponding source-line strap line with a first frequency, and CGWL strap cells and word-line strap cells may electrically couple a word line to a corresponding word-line strap line at a second frequency, to prevent large read voltage drops along the source line and the word line. The first frequency may, for example, be 32 bit lines or some other suitable value. The second frequency may, for example, be twice the first frequency or some other suitable multiple and/or may, for example, be 64 bit lines or some other suitable value.

With reference to FIG. 1, a schematic diagram 100 of some embodiments of an integrated chip comprising a memory array with an enhanced strap-cell architecture is provided. As seen hereafter, the enhanced strap-cell architecture is "enhanced" in that it reduces the number of distinct strap-cell types and reduces strap-line density. The memory array comprises a plurality of cells in a plurality of rows and a plurality of columns. The rows are respectively labeled $R_1$ through $R_{1+7}$ and the columns are respectively labeled $C_1$ through $C_3$, $C_n$ through $C_{n+2}$, and $C_o$ through $C_{o+1}$. The subscripts of the row and column labels identify corresponding row and column numbers. Further, 1 is an integer variable representing a row number whereas n and o are integer variables representing column numbers.

The plurality of cells comprises a plurality of boundary cells 102, a plurality of SLEG strap cells 104, a plurality of CGWL strap cells 106, a plurality of word-line strap cells 108, and a plurality of memory cells 110. Note that only some of each type of cell are labeled. The boundary cells 102 are unused cells at a boundary of a memory array and each span two rows. The boundary cells 102 offset the memory and strap cells from the boundary to protect the memory and strap cells from a large change in feature density, and hence a high degree of process non-uniformity, at the boundary. The SLEG strap cells 104, the CGWL strap cells 106, and the word-line strap cells 108 each span two rows and, although not visible, repeat along each of the rows. The SLEG strap cells 104 electrically couple source lines (not shown) and erase gates (not shown) to a corresponding source-line strap line 112 and a corresponding erase-gate strap line 114. The CGWL strap cells 106 electrically couple control gates (not shown) and word lines (not shown) to corresponding control-gate strap lines 116 and corresponding word-line strap lines 118. The word-line strap cells 108 electrically couple the word lines to corresponding to word-line strap lines 118. Note that only some of the control-gate strap lines 116 and only some of the word-line strap lines 118 are labeled. The control gates, the word lines, the erase gates, and the source lines extend along the rows and partially define the plurality of cells. The memory cells 110 store individual bits of data and may, for example, be third generation SUPERFLASH (ESF3) memory cells or some other suitable memory cells.

In some embodiments, the memory array is limited to the three distinct types of strap cells: 1) the SLEG strap cells 104; 2) the CGWL strap cells 106; and 3) the word-line strap cells 108. This small number of distinct strap-cell types simplifies design of the memory array compared to a memory array with four or more distinct strap-cell types, and further simplifies design of an interconnect structure for the memory array compared to an interconnect structure for a memory array with four or more distinct strap-cell types.

An interconnect structure interconnects the plurality of cells and comprises a plurality of wires 120 and a plurality of vias 122. Note that the wires 120 and the vias 122 are only labeled in the legend below the memory array. The wires 120 are grouped into a plurality of wire levels and the vias 122 are grouped into a plurality of via levels. A level corresponds to an elevation above the memory array when the integrated chip is viewed in cross section. The plurality of wire levels comprises a first wire level M1, a second wire level M2, a third wire level M3, and a fourth wire level M4. The wire levels are schematically illustrated by thicknesses of the wires 120 and elevation above the memory array increases with wire thickness. The plurality of via levels comprises a contact via level C0 (i.e., a zero via level), a first via level V1, a second via level V2, and a third via level V3. The via levels are schematically illustrated by shape and/or color. For example, a black circle corresponds to vias in the contact via level C0, whereas a white square corresponds to vias in the second via level V2.

Vias in the contact via level C0 extend from the cells to wires in the first wire level M1, and vias in the first via level V1 extend from wires in the first wire level M1 to wires in the second wire level M2. Further, vias in the second via level V2 extend from wires in the second wire level M2 to wires in the third wire level M3, and vias in the third via level V3 extend from wires in the third wire level M3 to wires in the fourth wire level M4. Note that where vias at different levels directly overlap, the intervening wires are not shown.

The plurality of wires 120 comprises a plurality of bit lines 124, a source-line shunt wire 126, and an erase-gate shunt wire 128 in the first wire level M1. Note that only some of the bit lines 124 are labeled. The bit lines 124 extend along columns (e.g., columns $C_3$, $C_n$, $C_{n+2}$, and $C_o$) at which the memory cells 110 are located and electrically couple to memory cells in corresponding columns through vias in the contact via level C0. The source-line and erase-gate shunt wires 126, 128 extend along the column (e.g., column $C_2$) at which the SLEG strap cells 104 are located and electrically couple respectively to source lines (not shown) and erase gates (not shown) at the SLEG strap cells 104 through vias in the contact via level C0.

Additionally, the plurality of wires 120 comprises the source-line strap line 112, the erase-gate strap line 114, the control-gate strap lines 116, and the word-line strap lines 118. The source-line and erase-gate strap lines 112, 114 are in the fourth wire level M4 and electrically couple respectively to the source-line and erase-gate shunt wires 126, 128 through vias in the first, second, and third via levels V1, V2, and V3. The control-gate strap lines 116 are in the third wire level M3 and electrically couple to control gates (not shown) in corresponding rows at the CGWL strap cells 106. Such electrical coupling is through vias in the contact via level C0 and the first and second via levels V1, V2. The word-line strap lines 118 are in the second wire level M2 and electrically couple to word lines (not shown) in corresponding rows at the CGWL strap cells 106 and the word-line strap cells 108. Such electrical coupling is through vias in the contact via level C0 and the first via level V1.

By arranging the erase-gate strap line 114, the control-gate strap lines 116, and the word-line strap lines 118 in different wire levels (e.g., M2, M3, and M4), instead of in a single wire level (e.g., M3), strap-line density is reduced (i.e., strap-line spacing is increased) for the various strap lines. Additionally, by reducing strap-line density, the memory array may be scaled down for process node 40 and beyond.

In some embodiments, spacing between strap lines decreases as the memory array scales down. Without the reduced strap-line density, the spacing between the strap lines may become less than the minimum spacing to prevent TDDB. Further, in some embodiments, ELK dielectric materials are used for inter-metal dielectric (IMD) layers as the memory array scales down. ELK dielectric materials tend to have high porosity and hence low TDDBs compared to their non-porous counterparts with higher dielectric constants. Due to the low TDDBs, the minimum spacing between strap lines is higher than when using the non-porous counterparts. Hence, use of ELK dielectric materials for IMD layers exacerbates the risk of TDDB and increases the importance of the reduced strap-line density.

While FIG. 1 illustrates the various strap lines and the various shunt wires as being in certain wire levels, some or all of the strap lines and/or some or all of the shunt wires may be in different wire levels in alternative embodiments. For example, the control-gate strap lines 116 may be in the second wire level M2 and the word-line strap lines 118 may be in the third wire level M3 in alternative embodiments. As another example, the erase-gate strap line 114 may be in the fourth wire level M4 and the source-line strap line 112 may be in a fifth wire level (not shown), or vice versa, in alternative embodiments.

Figure 2:
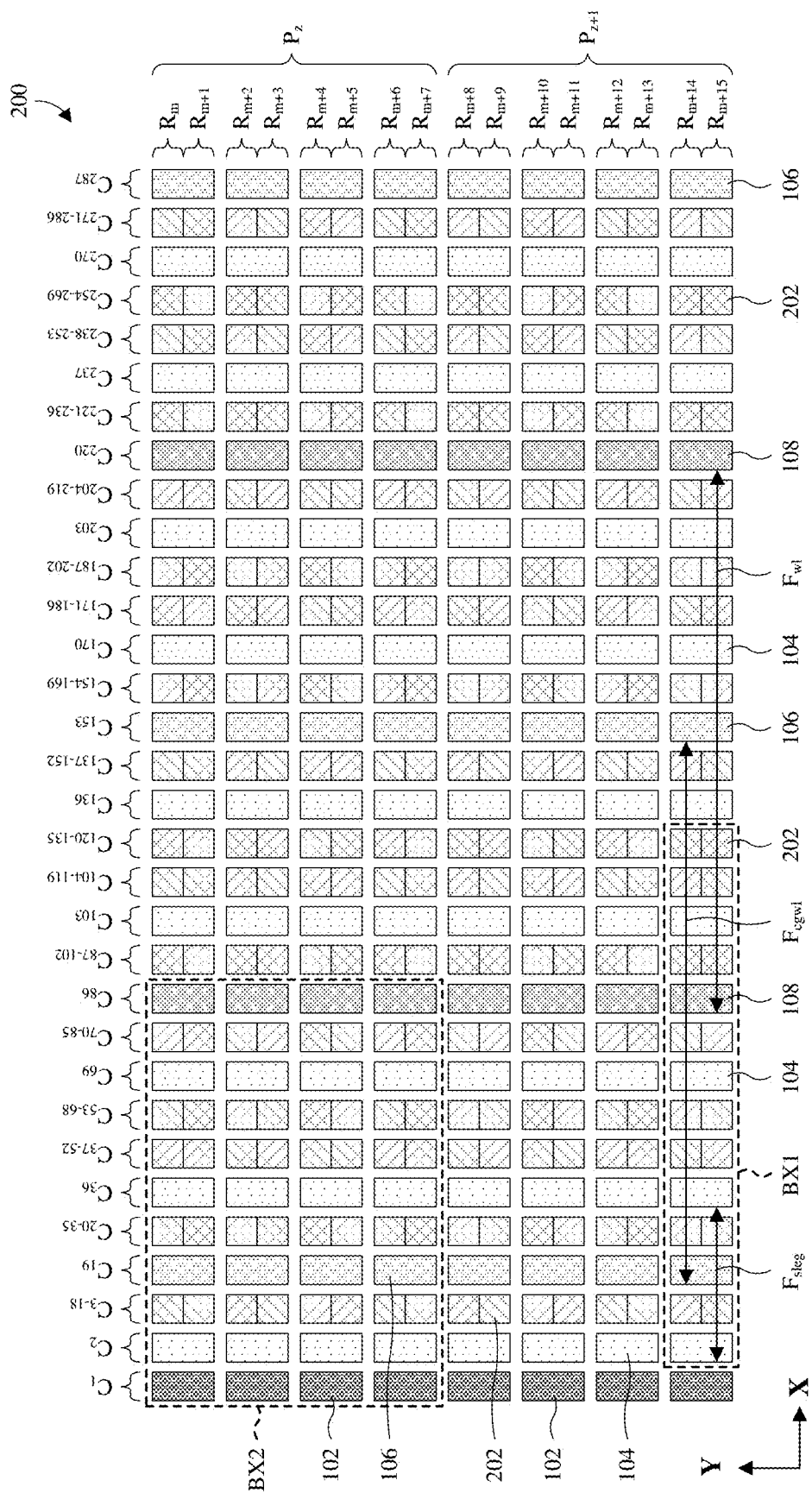
FIG. 2 illustrates a block diagram of some embodiments of an integrated chip comprising a memory array with the enhanced strap-cell architecture of FIG. 1.

With reference to FIG. 2, a block diagram 200 of some embodiments of an integrated chip comprising a memory array with the enhanced strap-cell architecture of FIG. 1 is provided. The memory array comprises a plurality of cells in a plurality of rows and a plurality of columns. The rows are respectively labeled $R_m$ through $R_{m+15}$ and the columns are respectively labeled $C_1$ through $C_{287}$. The subscripts of the row and column labels identify corresponding row and column numbers, and m is an integer variable representing a row number.

The plurality of cells comprises a plurality of memory-cell blocks 202. Note that only some of the memory-cell blocks 202 are labeled. Each of the memory-cell blocks 202 comprises a plurality of memory cells and has the same number of memory cells. The memory cells of each memory-cell block correspond to individual columns in the memory array, such that each of the memory-cell blocks 202 spans a plurality of columns. In some embodiments, as illustrated, each of the memory-cell blocks 202 has sixteen memory cells spanning sixteen columns. In alternative embodiments, each of the memory-cell blocks 202 has some other suitable number of memory cells spanning some other suitable number of columns. The memory cells of the memory-cell blocks 202 may, for example, be as the memory cells 110 of FIG. 1 are illustrated and/or described. In some embodiments, the memory-cell blocks 202 are at columns $C_{3-18}$, $C_{20-35}$, $C_{37-68}$, $C_{70-85}$, $C_{87-102}$, $C_{104-135}$, $C_{137-152}$, $C_{154-169}$, $C_{171-202}$, $C_{204-219}$, $C_{221-236}$, $C_{238-269}$, and $C_{271-286}$. Other columns are, however, amenable.

The plurality of cells further comprises the boundary cells 102 of FIG. 1, the plurality of SLEG strap cells 104 of FIG. 1, the plurality of CGWL strap cells 106 of FIG. 1, and the plurality of word-line strap cells 108 of FIG. 1. Note that only some of the boundary cells 102 are labeled and only some of each strap-cell type are labeled. As discussed in FIG. 1, the boundary cells 102 are unused cells at a boundary (e.g., column $C_1$) of a memory array and each span two rows. Further, the SLEG strap cells 104, the CGWL strap cells 106, and the word-line strap cells 108 each span two rows and repeat along the rows.

In some embodiments, the SLEG strap cells 104 are at columns $C_2$, $C_{36}$, $C_{69}$, $C_{103}$, $C_{136}$, $C_{170}$, $C_{203}$, $C_{237}$, and $C_{270}$. Other columns are, however, amenable. In some embodiments, the SLEG strap cells 104 are evenly spaced along the rows and/or repeat periodically along the rows with a SLEG frequency $F_{sleg}$. The SLEG frequency $F_{sleg}$ may, for example, be 32 memory cells (i.e., 32 bit lines) or some other suitable number of memory cells and/or bit lines. Further, the SLEG frequency $F_{sleg}$ may, for example, be two memory-cell blocks or some other suitable integer number of memory-cell blocks. In some embodiments, the SLEG frequency $F_{sleg}$ is 32 memory cells (i.e., 32 bit lines) or less so source lines are electrically coupled to corresponding source-line strap lines every 32 memory cells or less. By electrically coupling the source lines to corresponding source-line strap lines every 32 memory cells or less, voltage drops along the source lines are small. If the frequency at which source lines are electrically couple to corresponding source-line strap lines is more than 32 memory cells, voltage drops along the source-line strap lines may be large and may lead to read disturbance and/or failure.

In some embodiments, the CGWL strap cells 106 are at columns $C_{19}$, $C_{153}$, and $C_{287}$. Other columns are, however, amenable. In some embodiments, the CGWL strap cells 106 are evenly spaced along the rows and/or repeat periodically along the rows with a CGWL frequency $F_{cgwl}$. The CGWL frequency $F_{cgwl}$ may, for example, be 128 memory cells (i.e., 128 bit lines) or some other suitable number of memory cells and/or bit lines. Further, the CGWL frequency $F_{cgwl}$ may, for example, be eight memory-cell blocks or some other suitable integer number of memory-cell blocks and/or may, for example, be four times the SLEG frequency $F_{sleg}$ or some other suitable integer multiple of the SLEG frequency $F_{sleg}$.

In some embodiments, the word-line strap cells 108 are at columns $C_{86}$ and $C_{220}$. Other columns are, however, amenable. In some embodiments, the word-line strap cells 108 are evenly spaced along the rows and/or repeat periodically along the rows with a word-line frequency $F_{wl}$. The word-line frequency $F_{wl}$ may, for example, be 128 memory cells (i.e., 128 bit lines) or some other suitable number of memory cells and/or bit lines. Further, the word-line frequency $F_{wl}$ may, for example, be eight memory-cell blocks or some other suitable integer number of memory-cell blocks and/or may, for example, be four times that of the SLEG frequency $F_{sleg}$ or some other suitable integer multiple of the SLEG frequency $F_{sleg}$. Further, the word-line frequency $F_{wl}$ may, for example, be the same as the CGWL frequency $F_{cgwl}$.

In some embodiments, the CGWL strap cells 106 and the word-line strap cells 108 alternate and repeat along the rows so word lines are electrically coupled to corresponding word-line strap lines every 64 memory cells (i.e., 64 bit lines) or less. By electrically coupling the word lines to corresponding word-line strap lines every 64 memory cells or less, voltage drops along the word lines are small. If the frequency at which word lines are electrically couple to corresponding word-line strap lines is more than 64 memory cells, voltage drops along the word lines may be large and may lead to read disturbance and/or failure.

In some embodiments, a portion of the memory array in box BX1 repeats along each of the rows, beginning at the boundary cells 102. In some embodiments, the rows of the memory array are grouped into a plurality of memory pages. For clarity, the memory pages are respectively labeled $P_z$ and $P_{z+1}$, where subscripts identify corresponding page numbers and z is an integer variable representing a page number. In some embodiments, as illustrated, each memory page is a portion of the memory array defined by eight consecutive rows. In alternative embodiments, each memory page is defined by one, two, sixteen, or some other suitable number of consecutive rows. In some embodiments, a portion of the memory array in box BX2 repeats at each of the memory pages and/or the schematic diagram 100 of FIG. 1 is taken within box BX2. As to the latter, column $C_{o+1}$ of FIG. 1 may, for example, be the same as column $C_{86}$ of FIG. 2 and/or row $R_1$ of FIG. 1 may, for example, be the same as row $R_m$ of FIG. 2.

While not shown in FIG. 2, an interconnect structure interconnects the plurality of cells and comprises a plurality of word-line strap lines, a plurality of control-gate strap lines, a plurality of erase-gate strap lines, and a plurality of source-line strap lines. Each row has an individual word-line strap line extending along the row and further has an individual control-gate strap line extending along the row. Each memory page has an individual erase-gate strap line shared by first rows of the memory page and extending along the first rows. Similarly, each memory page has an individual source-line strap line shared by second rows of the memory page and extending along the second rows. The word-line strap lines, the control-gate strap lines, the erase-gate strap lines, and the source-line strap lines may, for example, be as their counterparts are described and/or illustrated with regard to FIG. 1.

The interconnect structure further comprises a plurality of source-line shunt wires and a plurality of erase-gate shunt wires. Each memory page has a plurality of individual source-line shunt wires, and each memory page has a plurality of individual erase-gate shunt wires. The individual source-line shunt wires of each memory page are respectively at the columns with SLEG strap cells 104, and the individual erase-gate shunt wires of each memory page are respectively at the columns with SLEG strap cells 104. The source-line shunt wires and the erase-gate shunt wires may, for example, be as their counterparts are described and/or illustrated with regard to FIG. 1.

Figure 3:
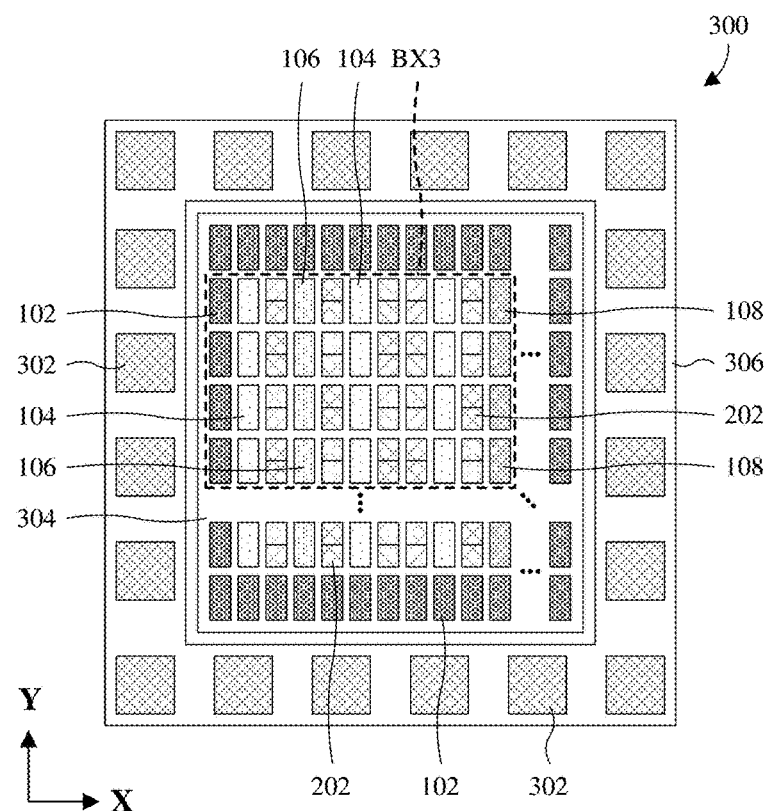
FIG. 3 illustrates a block diagram of some embodiments of an integrated chip comprising a memory array with the enhanced strap-cell architecture of FIG. 1 and further comprising peripheral devices surrounding the memory array.

With reference to FIG. 3, a block diagram 300 of some embodiments of an integrated chip comprising a memory array with the enhanced strap-cell architecture of FIG. 1, and further comprising peripheral devices 302 surrounding the memory array, is provided. The memory array is at a memory region 304 of the integrated chip and comprises the boundary cells 102 of FIG. 1, the SLEG strap cells 104 of FIG. 1, the CGWL strap cells 106 of FIG. 1, and the word-line strap cells 108 of FIG. 1. Further, the memory array comprises the memory-cell blocks 202 of FIG. 2. Note that only some of the boundary cells 102 are labeled, only some of the memory-cell blocks 202 are labeled, and only some of each strap-cell type are labeled. In some embodiments, the schematic diagram 100 of FIG. 1 is taken within box BX3.

The peripheral devices 302 are at a peripheral region 306 of the integrated chip that surrounds the memory region 304. Note that only some of the peripheral devices 302 are labeled. The peripheral devices 302 may, for example, be or comprise transistors and/or some other suitable semiconductor device(s). Further, the peripheral devices 302 may, for example, implement read/write circuitry and/or some other suitable circuitry for operation of the memory array. By integrating the peripheral devices 302 and the memory array on a common integrated chip, the memory array may also be known as an embedded memory array.

Figure 4A:
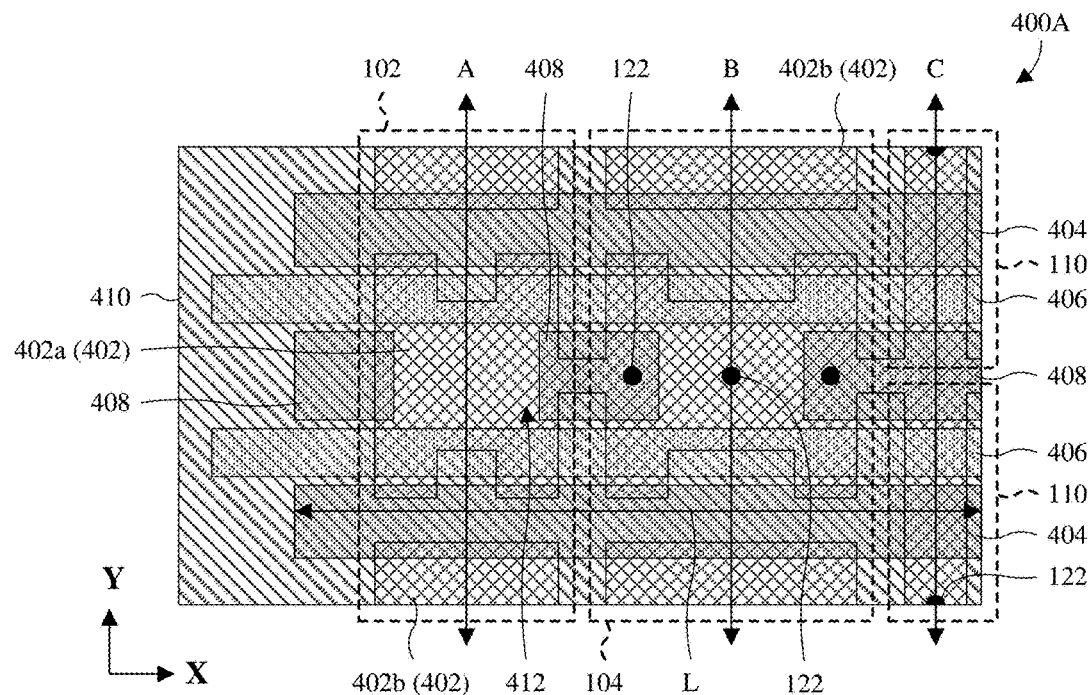
FIGS. 4A and 4B illustrate top layouts of some embodiments of integrated chips comprising a boundary cell of FIG. 1, a source-line/erase-gate (SLEG) strap cell of FIG. 1, and memory cells of FIG. 1.

With reference to FIG. 4A, a top layout 400A of some embodiments of an integrated chip comprising a boundary cell 102 of FIG. 1, a SLEG strap cell 104 of FIG. 1, and memory cells 110 of FIG. 1 is provided. The boundary cell 102, the SLEG strap cell 104, and the memory cells 110 are on an erase-gate-side device region 402a and a plurality of word-line-side device regions 402b. Note that only some of the word-line-side device regions 402b is labeled. Further, the boundary cell 102, the SLEG strap cell 104, and the memory cells 110 are defined in part by a pair of word lines 404, a pair of control gates 406, and an erase gate 408.

The erase-gate-side and word-line-side device regions 402a, 402b correspond to top regions of a substrate 402 (when viewed in cross section) that are surrounded and demarcated by an isolation structure 410. The erase-gate-side device region 402a is shared by the boundary cell 102, the SLEG strap cell 104, and the memory cells 110. The word-line-side device regions 402b are different for the boundary cell 102 and the SLEG strap cell 104. The substrate 402 may be or comprise, for example, a bulk monocrystalline silicon substrate, a silicon-on-insulator (SOI) substrate, or some other suitable semiconductor substrate. The isolation structure 410 may be or comprise, for example, silicon oxide and/or some other suitable dielectric material(s) and/or may be or comprise, for example, a shallow trench isolation (STI) structure or some other suitable isolation structure.

The word lines 404, the control gates 406, and the erase gate 408 are elongated in parallel along individual lengths L and are spaced from each other in a direction perpendicular or otherwise transverse to the lengths L. Note that only one of the lengths L is labeled. The control gates 406 are between and respectively border the word lines 404, and the erase gate 408 is between and borders the control gates 406. In contrast with the word lines 404 and the control gates 406, the erase gate 408 has discontinuities 412 along its length, respectively at the boundary cell 102 and the SLEG strap cell 104. Note that only one of the discontinuities 412 is labeled. The word lines 404, the control gates 406, and the erase gate 408 may be or comprise, for example, doped polysilicon and/or some other suitable conductive material(s).

A plurality of vias 122 at the contact via level (i.e., contact vias) is on the SLEG strap cell 104 and the memory cells 110. Note that only some of the vias 122 are labeled. Contact vias at the SLEG strap cell 104 electrically couple the erase gate 408 to a corresponding erase-gate strap line (not shown), and further electrically couple a source line (not shown) underlying the erase gate 408 (when viewed in cross section) to a corresponding source-line strap line (not shown). Contact vias at the memory cells 110 electrically couple individual source/drain regions (not shown) of the memory cells 110 to a corresponding bit line (not shown).

Figure 4B:
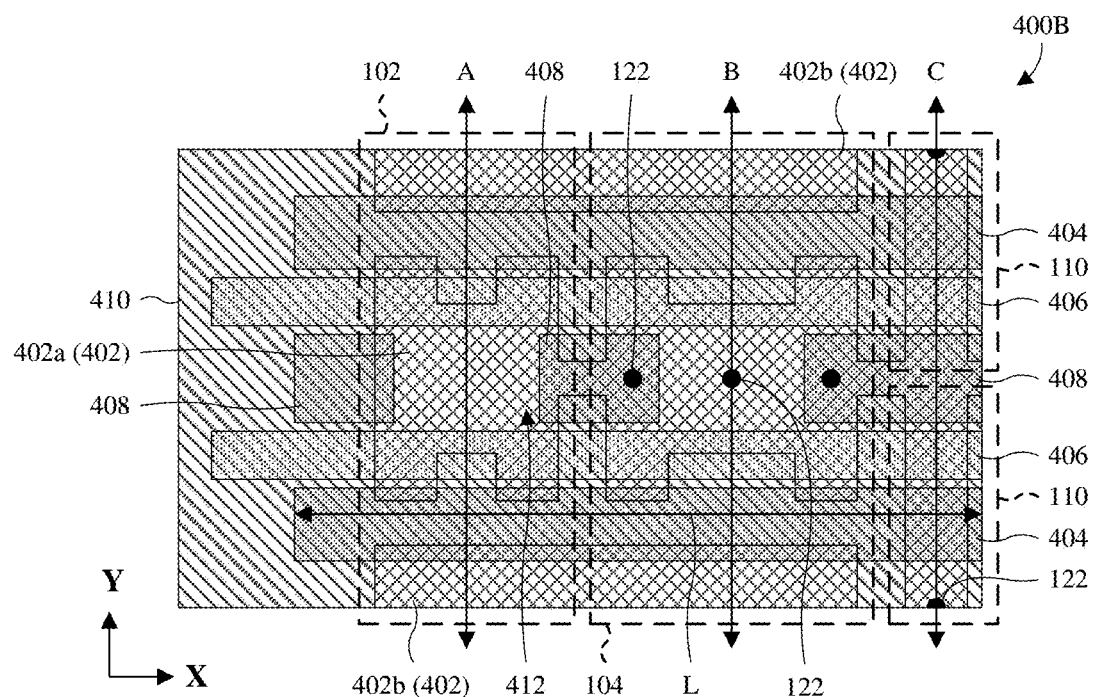

With reference to FIG. 4B, a top layout 400B of some alternative embodiments of the integrated chip of FIG. 4A is provided in which the boundary cell 102 and the SLEG strap cell 104 share word-line-side device regions 402b.

Figure 5A:
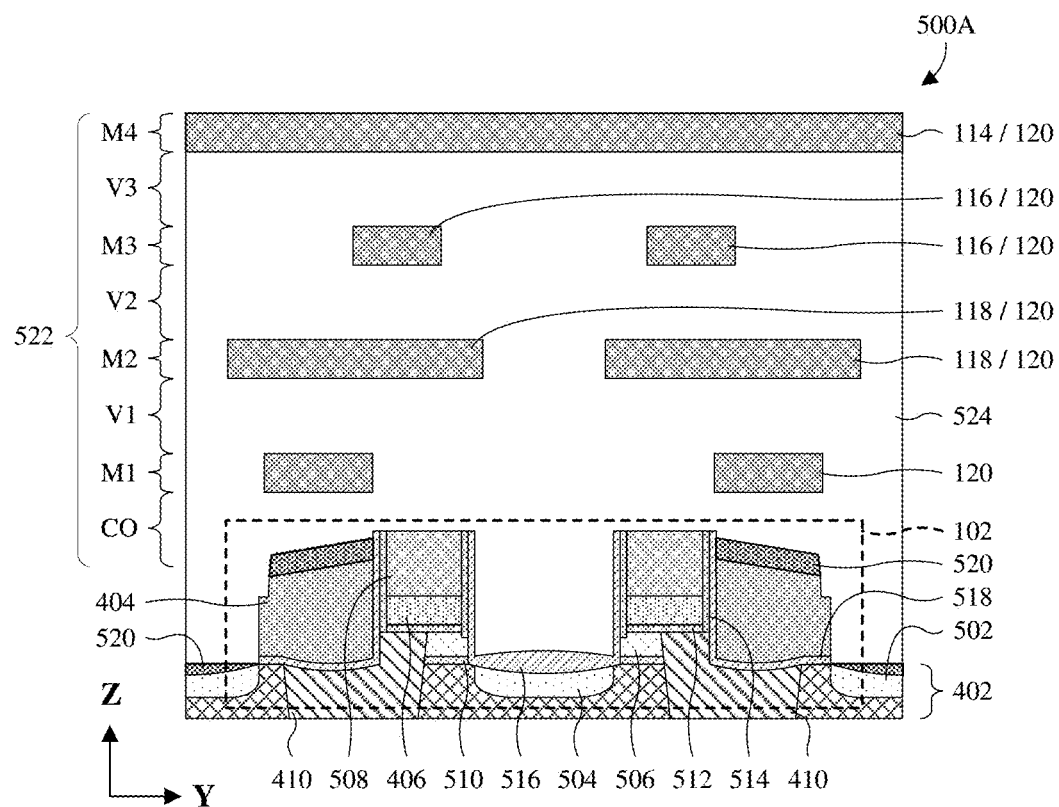
FIGS. 5A-5C illustrate cross-sectional views of some embodiments of the integrated chip of FIG. 4A or 4B respectively at the boundary cell, the SLEG strap cell, and the memory cell.

With reference to FIG. 5A, a cross-sectional view 500A of some embodiments of the integrated chip of FIG. 4A and/or FIG. 4B is provided at the boundary cell 102. The cross-sectional view 500A may, for example, be taken along line A in FIG. 4A and/or FIG. 4B. The word lines 404 and the control gates 406 overlie the substrate 402 and the isolation structure 410. Further, the word lines 404 and the control gates 406 respectively border source/drain regions 502 and a source line 504 in the substrate 402. The word lines 404 are between and respectively border the source/drain regions 502, and the control gates 406 are respectively on opposite sides of the source line 504. Note that only one of the word lines 404, only one of the control gates 406, and only one of the source/drain regions 502 are labeled.

The source/drain regions 502 and the source line 504 are doped regions of the substrate 402. The source/drain regions 502 and the source line 504 may, for example, share a doping type (e.g., p-type or n-type) and/or may, for example, have opposite doping types as adjoining regions of the substrate 402. During operation of the integrated chip, conductive channels (not shown) may form under the word lines 404 and the control gates 406, along a top surface of the substrate 402. The isolation structure 410 prevents the conductive channels from extending from the source/drain regions 502 to the source line 504 at the boundary cell 102.

The control gates 406 overlie individual floating gates 506 and are covered by individual control-gate hard masks 508. The floating gates 506 are spaced from the substrate 402 by individual floating-gate dielectric layers 510 and are spaced from the control gates 406 by individual control-gate dielectric layers 512. Note that only one of the floating gates 506, only one of the control-gate hard masks 508, only one of the floating-gate dielectric layers 510, and only one of the control-gate dielectric layers 512 are labeled. The floating gates 506 may be or comprise, for example, doped polysilicon and/or some other suitable conductive material(s). The floating-gate dielectric layers 510 may be or comprise, for example, silicon oxide and/or some other suitable dielectric(s). The control-gate hard masks 508 and/or the control-gate dielectric layers 512 may be or comprise, for example, silicon oxide, silicon nitride, some other suitable dielectric(s), or any combination of the foregoing.

The control gates 406 are lined by individual control-gate sidewall spacers 514, and the floating gates 506 and the source line 504 are lined by an erase-gate dielectric layer 516. Further, the word lines 404 are lined by individual word-line dielectric layers 518. Note that only one of the control-gate sidewall spacers 514 and only one of the word-line dielectric layers 518 are labeled. The erase-gate dielectric layer 516 separates an erase gate (out of view) from the floating gates 506, the source line 504, and the control-gate sidewall spacers 514. The word-line dielectric layers 518 separate the word lines 404 from the control-gate sidewall spacers 514 and the substrate 402. The control-gate sidewall spacers 514 may be or comprise, for example, silicon oxide, silicon nitride, some other suitable dielectric(s), or any combination of the foregoing. The erase-gate dielectric layer 516 and/or the word-line dielectric layers 518 may be or comprise, for example, silicon oxide and/or some other suitable dielectric(s).

Silicide layers 520 respectively cover the word lines 404 and the source/drain regions 502, and an interconnect structure 522 covers the silicide layers 520 and the boundary cell 102. Note that only some of the silicide layers 520 are labeled. The silicide layers 520 may, for example, be or comprise nickel silicide and/or some other suitable silicide. The interconnect structure 522 comprises an interconnect dielectric layer 524, and further comprises a plurality wires 120 and a plurality of vias (none of which are visible in FIG. 5A) stacked in the interconnect dielectric layer 524. The interconnect dielectric layer 524 may, for example, be or comprises an ELK dielectric material and/or some other suitable dielectric material(s). The ELK dielectric material may, for example, have a dielectric constant less than about 2.5, 2.0, or some other suitable value and/or may, for example, be or comprise porous silicon oxycarbide (SiOC) and/or some other suitable ELK dielectric material(s)

The wires 120 are grouped into a first wire level M1, a second wire level M2, a third wire level M3, and a fourth wire level M4, whereas the vias are grouped into a contact via level CO, a first via level V1, a second via level V2, and a third via level V3. At the second wire level M2, word-line strap lines 118 respectively overlie the word lines 404. The word-line strap lines 118 are electrically coupled to the word lines 404 outside of the cross-sectional view 500A of FIG. 5A. At the third wire level M3, control-gate strap lines 116 respectively overlie the control gates 406. The control-gate strap lines 116 are electrically coupled to the control gates 406 outside of the cross-sectional view 500A of FIG. 5A. At the fourth wire level M4, an erase-gate strap line 114 overlies the boundary cell 102. The erase-gate strap line 114 is electrically coupled to an erase gate (not shown) outside of the cross-sectional view 500A of FIG. 5A.

The wires 120 and the vias have lower resistances than the word lines 404, the control gates 406, the erase gate, and the source line 504. Hence, electrically coupling the various strap lines periodically to the word lines 404, the control gates 406, the source line 504, and erase gate reduces voltage drops therealong. The wires 120 and the vias may be or comprise, for example, copper, aluminum copper, aluminum, tungsten, some other suitable metal(s), some other suitable conductive material(s), or any combination of the foregoing. In some embodiments, the word lines 404, the control gates 406, and the erase gate comprise doped polysilicon and the source line 504 comprises doped monocrystalline silicon, whereas the wires 120 and the vias comprise metal. Other materials are, however, amenable in alternative embodiments.

Figure 5B:
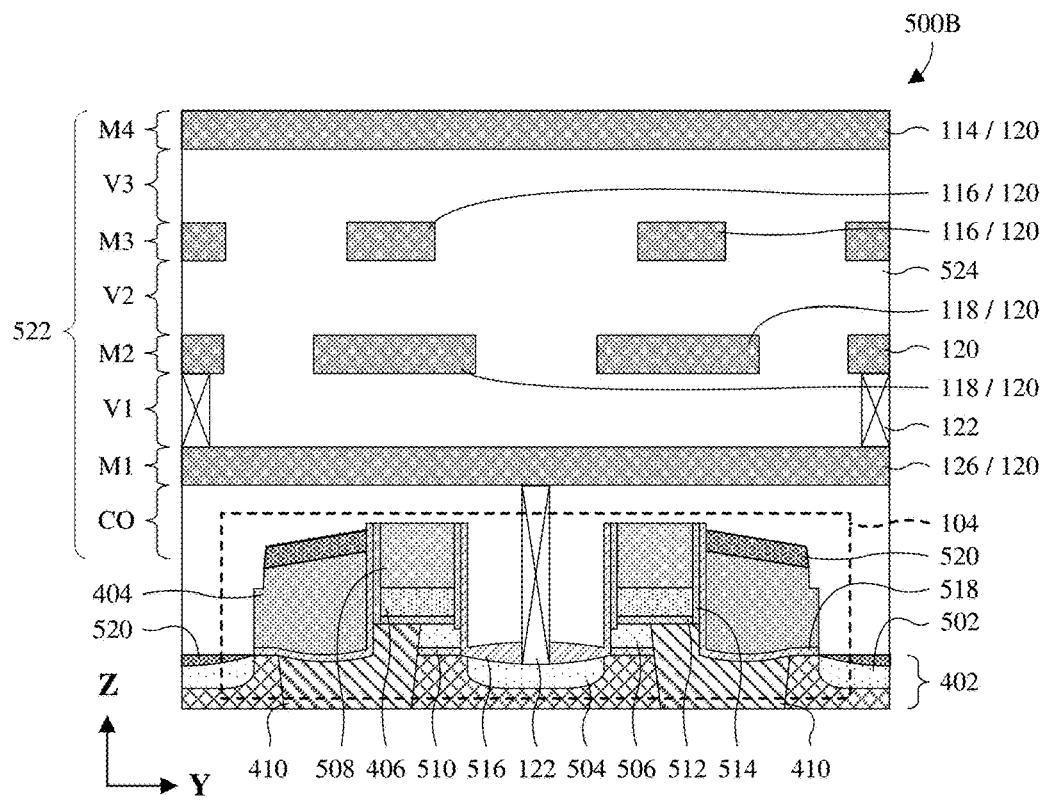

With reference to FIG. 5B, a cross-sectional view 500B of some embodiments of the integrated chip of FIG. 4A and/or FIG. 4B is provided at the SLEG strap cell 104. The cross-sectional view 500B may, for example, be taken along line B in FIG. 4A and/or FIG. 4B. The SLEG strap cell 104 is as the boundary cell 102 of FIG. 5A is illustrated and/or described, except that the source line 504 is electrically coupled to a source-line shunt wire 126 at the first wire level M1.

Figure 5C:
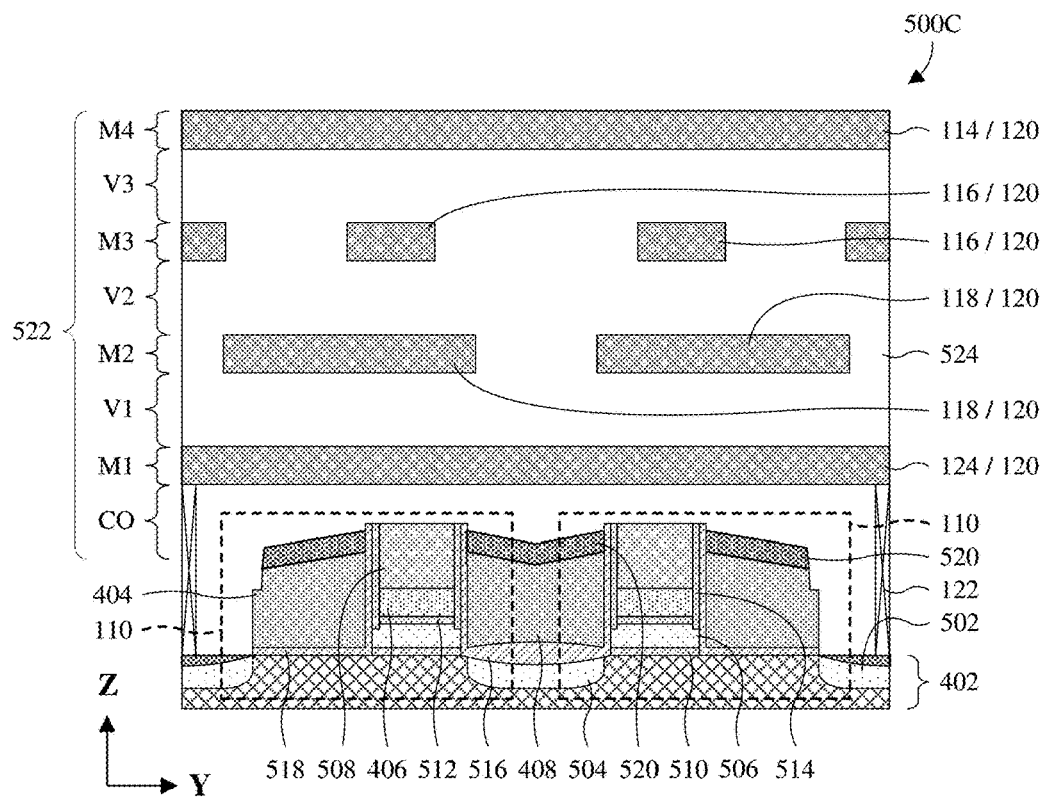

With reference to FIG. 5C, a cross-sectional view 500C of some embodiments of the integrated chip of FIG. 4A and/or FIG. 4B is provided at the memory cells 110. The cross-sectional view 500C may, for example, be take along line C in FIG. 4A and/or FIG. 4B. The memory cells 110 are as the boundary cell 102 of FIG. 5A is illustrated and/or described with a few exceptions. An erase gate 408 covers the source line 504, and the silicide layers 520 cover the erase gate 408. Further, the isolation structure 410 (see FIG. 5A) is removed and the source/drain regions 502 are electrically coupled to a bit line 124 at the first wire level M1. Note that only some of the silicide layers 520 and only one of the source/drain regions 502 are labeled.

By removing the isolation structure 410 from under the memory cells 110, conductive channels (not shown) may form under the memory cells 110, along a top surface of the substrate 402. Such conductive channels may extend from the source/drain regions 502 to the source line 504 to facilitate reading and/or writing to the memory cells 110.

Figure 6A:
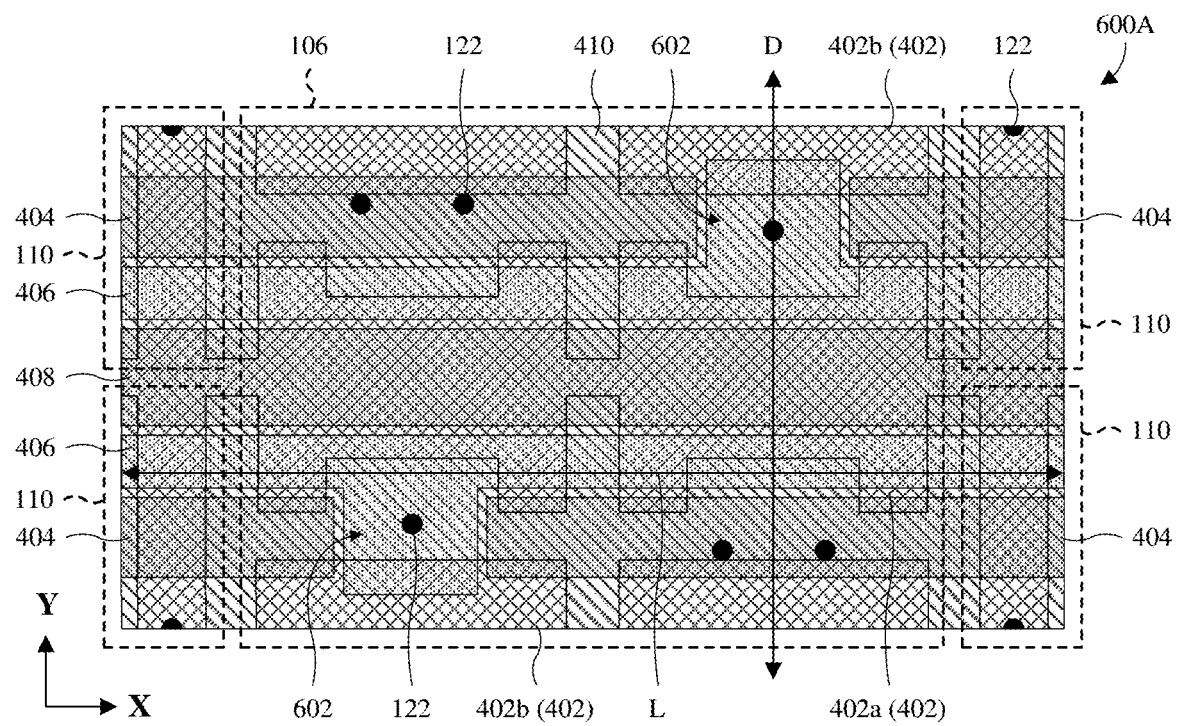
FIGS. 6A and 6B illustrate top layouts of some embodiments of integrated chips comprising a control-gate/word-line (CGWL) strap cell of FIG. 1 and memory cells of FIG. 1.

With reference to FIG. 6A, a top layout 600A of some embodiments of an integrated chip comprising a CGWL strap cell 106 of FIG. 1 and memory cells 110 of FIG. 1 is provided. The CGWL strap cell 106 and the memory cells 110 are on an erase-gate-side device region 402a of a substrate 402, a plurality of word-line-side device regions 402b of the substrate 402, and an isolation structure 410. Note that only some of the word-line-side device regions 402b are labeled. The substrate 402, the erase-gate-side and word-line-side device regions 402a, 402b, and the isolation structure 410 may, for example, be as described with regard to FIG. 4A.

A pair of word lines 404, a pair of control gates 406, and an erase gate 408 partially define the CGWL strap cell 106 and the memory cells 110. The word lines 404, the control gates 406, and the erase gate 408 may, for example, be as described with regard to FIG. 4A, except that the erase gate 408 is continuous at the CGWL strap cell 106 and the memory cells 110. Further, the control gates 406 have individual pad regions 602 at the CGWL strap cell 106. The pad regions 602 are diagonally opposite and each protrude from a single side of a respective one of the control gates 406 through a neighboring one of the word lines 404. This, in turn, introduces discontinuities along individual lengths of the word lines 404.

A plurality of vias 122 at the contact via level (i.e., contact vias) is on the CGWL strap cell 106 and the memory cells 110. Note that only some of the vias 122 are labeled. Contact vias at the CGWL strap cell 106 electrically couple the pad regions 602 to corresponding control-gate strap line (not shown), and further electrically couple the word lines 404 to corresponding word-line strap lines (not shown). Contact vias at the memory cells 110 electrically couple individual source/drain regions (not shown) of the memory cells 110 to corresponding bit lines (not shown).

Figure 6B:
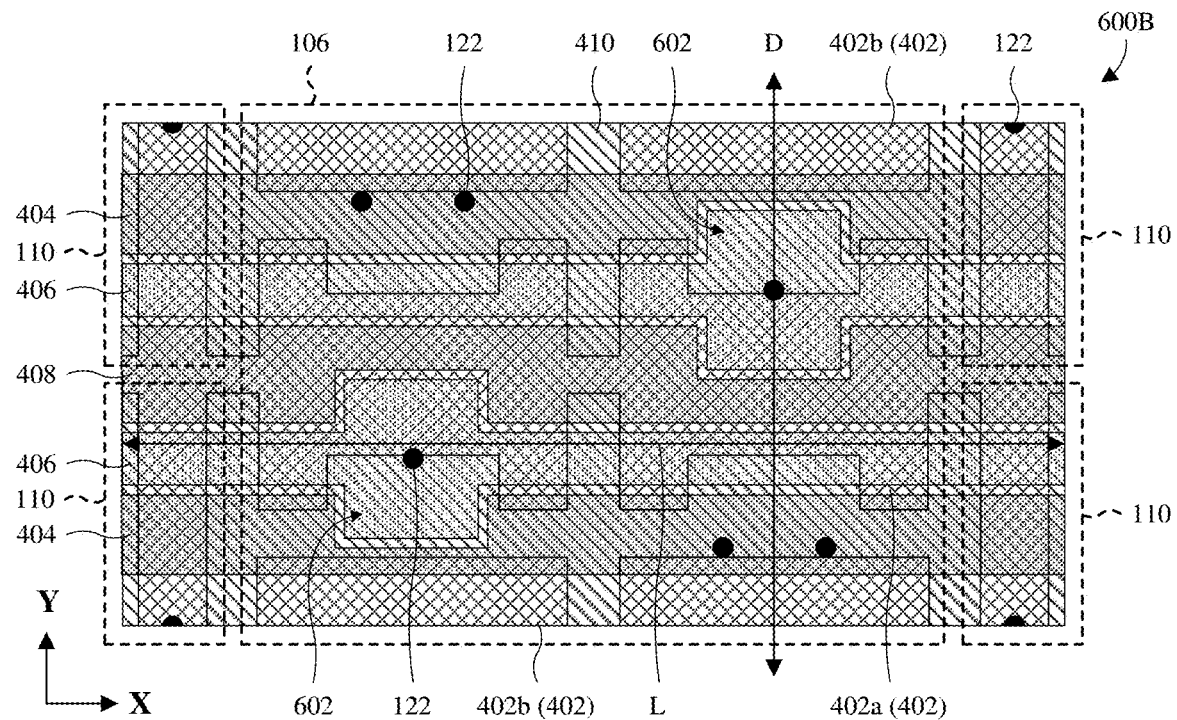

With reference to FIG. 6B, a top layout 600B of some alternative embodiments of the integrated chip of FIG. 6A is provided in which the pad regions 602 of the control gates 406 each protrude from opposite sides of a respective one of the control gates 406. Further, the erase gate 408 conforms around the pad regions 602 and the word lines 404 are continuous at the pad regions 602.

Figure 7A:
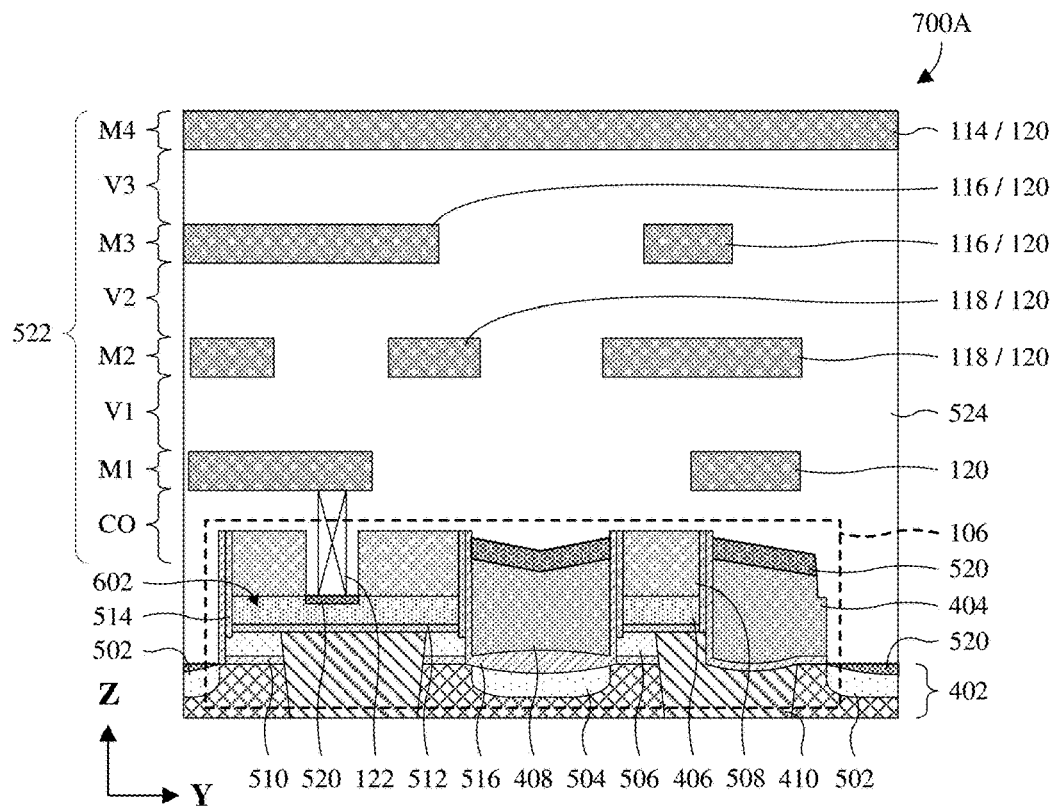
FIGS. 7A and 7B illustrate cross-sectional views of some embodiments respectively of the integrated chips of FIGS. 6A and 6B at the CGWL strap cell.

With reference to FIG. 7A, a cross-sectional view 700A of some embodiments of the integrated chip of FIG. 6A is provided at the CGWL strap cell 106. The cross-sectional view 700A may, for example, be taken along line D in FIG. 7A. The SLEG strap cell 104 is as the boundary cell 102 of FIG. 5A is illustrated and/or described, except that the source line 504 is covered by an erase gate 408 and a leftmost one of the control gates 406 has a pad region 602. Further, there is no word line between the pad region 602 and a neighboring one of the source/drain regions 502. Note that only one of the control gates 406 and only one of the source/drain regions 502 are labeled. The pad region 602 is electrically coupled to an overlying control-gate strap line 116 through the interconnect structure 522.

Figure 7B:
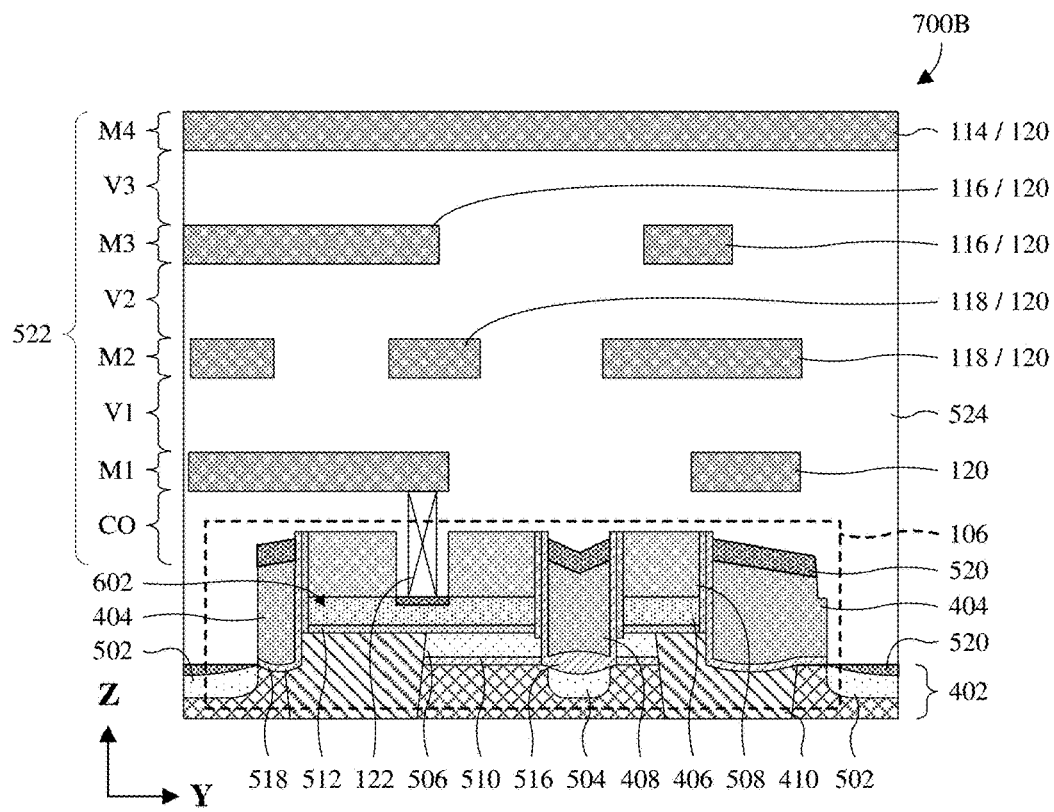

With reference to FIG. 7B, a cross-sectional view 700B of some embodiments of the integrated chip of FIG. 6B is provided at the CGWL strap cell 106. The cross-sectional view 700B may, for example, be taken along line D in FIG. 7B and is variant of FIG. 7A in which a word line 404 is between the pad region 602 and a neighboring source/drain region 502.

Figure 8A:
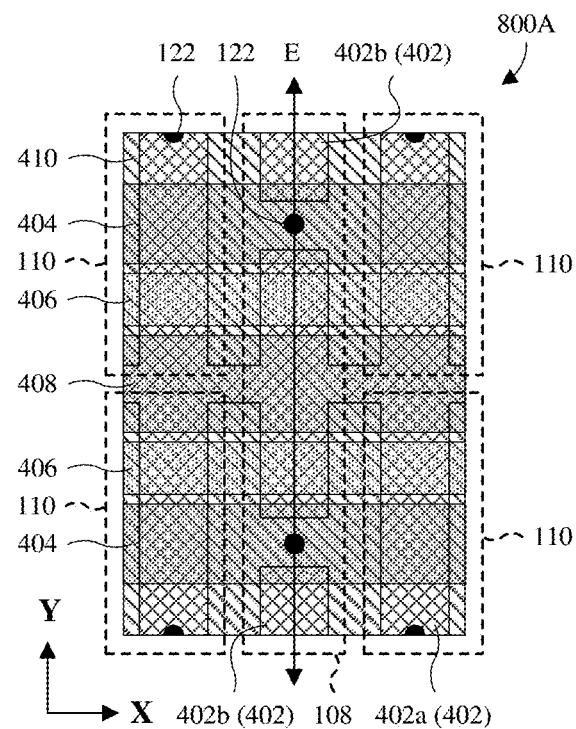
FIGS. 8A and 8B illustrate top layouts of some embodiments of integrated chips comprising a word-line strap cell of FIG. 1 and memory cells of FIG. 1.

With reference to FIG. 8A, a top layout 800A of some embodiments of an integrated chip comprising a word-line strap cell 108 of FIG. 1 and memory cells 110 of FIG. 1 is provided. The word-line strap cell 108 and the memory cells 110 are on an erase-gate-side device region 402a of a substrate 402, a plurality of word-line-side device regions 402b of the substrate 402, and an isolation structure 410. The substrate 402, the erase-gate-side and word-line-side device regions 402a, 402b, and the isolation structure 410 may, for example, be as described with regard to FIG. 4A.

A pair of word lines 404, a pair of control gates 406, and an erase gate 408 partially define the word-line strap cell 108 and the memory cells 110. The word lines 404, the control gates 406, and the erase gate 408 may, for example, be as described with regard to FIG. 4A, except that the erase gate 408 is continuous at the word-line strap cell 108.

A plurality of vias 122 at the contact via level (i.e., contact vias) is on the word-line strap cell 108 and the memory cells 110. Note that only some of the vias 122 are labeled. Contact vias at the word-line strap cell 108 electrically couple the word lines 404 to corresponding word-line strap lines (not shown). Contact vias at the memory cells 110 electrically couple individual source/drain regions (not shown) of the memory cells 110 to corresponding bit lines (not shown).

Figure 8B:
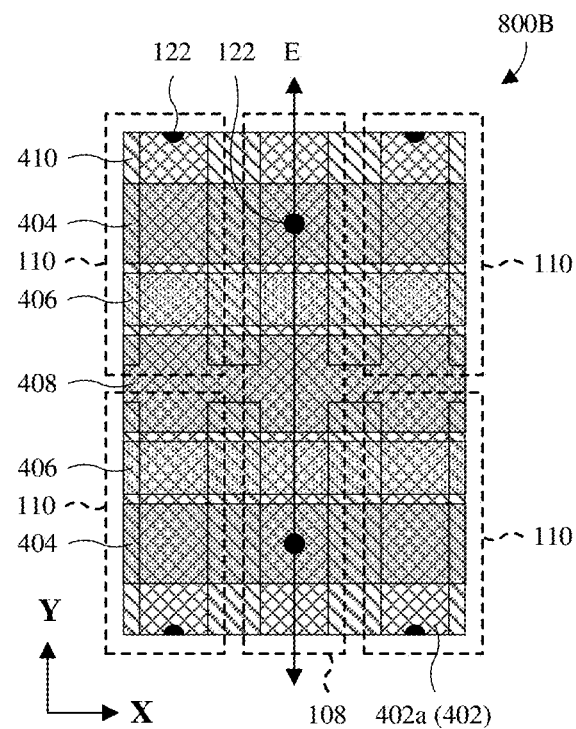

With reference to FIG. 8B, a top layout 800B of some alternative embodiments of the integrated chip of FIG. 8A is provided in which the word-line-side device regions 402b are omitted or otherwise integrated with the erase-gate-side device region 402a.

Figure 9A:
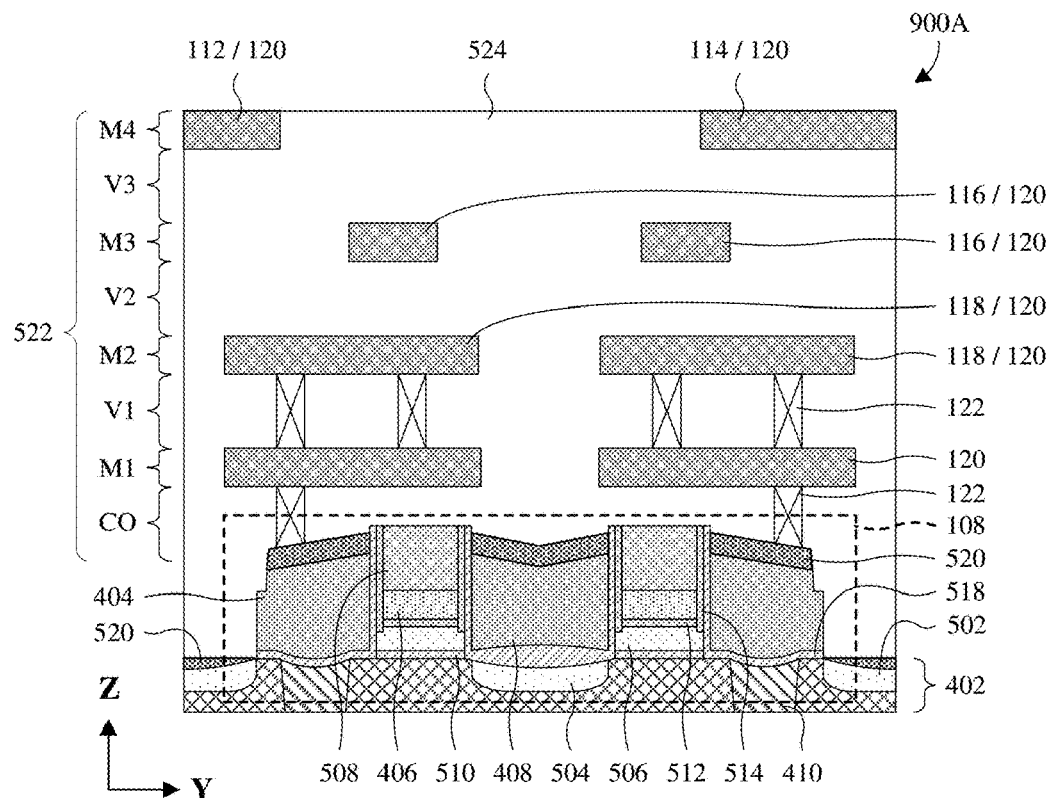
FIGS. 9A and 9B illustrate cross-sectional views of some embodiments respectively of the integrated chips of FIGS. 8A and 8B at the word-line strap cell.

With reference to FIG. 9A, a cross-sectional view 900A of some embodiments of the integrated chip of FIG. 8A is provided at the word-line strap cell 108. The cross-sectional view 900A may, for example, be taken along line E in FIG. 8A. The word-line strap cell 108 is as the boundary cell 102 of FIG. 5A is illustrated and/or described, except that the source line 504 is covered by an erase gate 408 and the isolation structure 410 is localized under the word lines 404. Further, the word lines 404 are electrically coupled to corresponding word-line strap lines 118 in the interconnect structure 522.

Figure 9B:
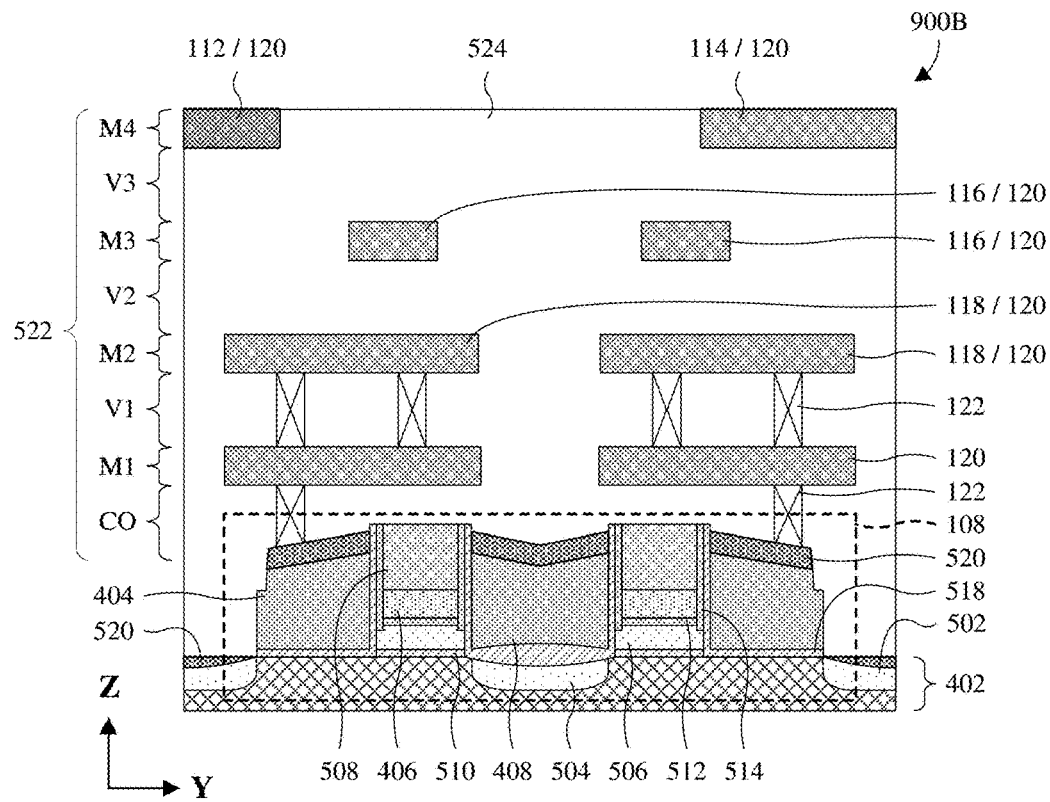

With reference to FIG. 9B, a cross-sectional view 900B of some embodiments of the integrated chip of FIG. 8B is provided at the word-line strap cell 108. The cross-sectional view 900B may, for example, be taken along line E in FIG. 8B and is variant of FIG. 9A in which the isolation structure 410 is omitted from under the word-line strap cell 108.

With reference to FIGS. 10A-10F, top layouts 1000A-1000F of some embodiments of the integrated chip of FIG. 1 respectively at different levels of the integrated chip are provided in which the memory array comprises additional columns. The additional columns are between column $C_{n+2}$ and column $C_o$ and comprise columns $C_p$ through $C_{p+2}$ and columns $C_q$ through $C_{q+2}$, where n, o, p, and q are integer variables representing column numbers.

Boundary cells 102 repeat along column $C_1$, and memory cells 110 repeat along columns $C_3$, $C_n$, $C_{n+2}$, $C_p$, $C_{p+2}$, $C_q$, $C_{q+2}$, and $C_o$. Other columns are, however, amenable. Additionally, note that only one boundary cell and only one memory cell are labeled. The boundary cells 102 may, for example, each have a top layout as shown in FIG. 4A and/or FIG. 4B and/or may, for example, each have a cross-sectional view as shown in FIG. 5A. For example, FIG. 5A may be taken along line A in FIGS. 10A-10F. The memory cells 110 may, for example, each have a top layout as shown in any one or combination of FIGS. 4A, 4B, 6A, 6B, 8A, and 8B and/or may, for example, each have a cross-sectional view as shown in FIG. 5C. For example, FIG. 5C may, for example, be taken along line C in FIGS. 10A-10F.

SLEG strap cells 104 repeat along columns $C_2$, $C_{p+1}$, and $C_{q+1}$, CGWL strap cells 106 repeat along column $C_{n+1}$, and word-line strap cells 108 repeat along column $C_{o+1}$. Other columns are, however, amenable. Additionally, note that only one of each type of cell has been labeled for readability. The SLEG strap cells 104 may, for example, each have a top layout as shown in FIG. 4A and/or FIG. 4B and/or may, for example, each have a cross-sectional view as shown in FIG. 5B. For example, FIG. 5B may be taken along line B in FIGS. 10A-10F. The CGWL strap cells 106 may, for example, each have a top layout as shown in FIG. 6A and/or FIG. 6B and/or may, for example, each have a cross-sectional view as shown in FIG. 7A and/or FIG. 7B. For example, FIGS. 7A and 7B may be taken along line D in FIGS. 10A-10F. The word-line strap cells 108 may, for example, each have a top layout as shown in FIG. 8A and/or FIG. 8B and/or may, for example, each have a cross-sectional view as shown in FIG. 9A and/or FIG. 9B. For example, FIGS. 9A and 9B may be taken along line E in FIGS. 10A-10F.

Figure 10A:
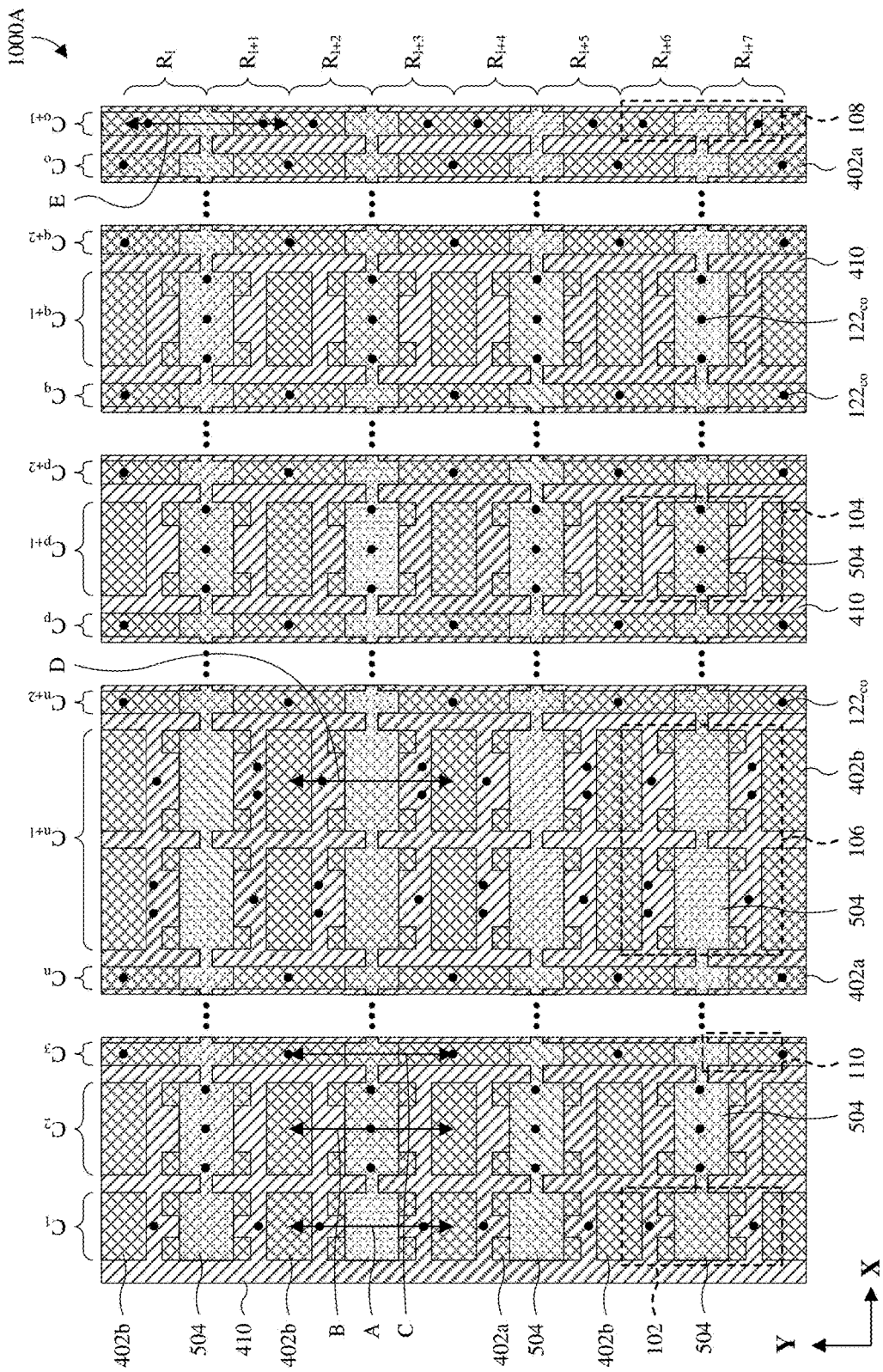
FIGS. 10A-10F illustrate top layouts of some embodiments of the integrated chip of FIG. 1 respectively at different levels of the integrated chip and in which the memory array comprises additional columns.

With specific reference to the top layout 1000A of FIG. 10A, an erase-gate-side device region 402a and a plurality of word-line-side device regions 402b are surrounded and demarcated by an isolation structure 410. Further, a plurality of source lines 504 and a plurality of contact vias $122_{co}$ (i.e., vias at a contact via level) are on the erase-gate-side device region 402a and the word-line-side device regions 402b. Note that only some of the word-line-side device regions 402b, only some of the source lines 504, and some of the contact vias $122_{co}$ are labeled. The source lines 504 are in the erase-gate-side device regions 402a and are elongated along corresponding rows. The contact vias $122_{co}$ electrically couple select portions (e.g., the source lines 504) of the erase-gate-side device regions 402a, as well as gate structures (not shown) on the erase-gate-side device region 402a, to corresponding strap and bit lines overlying the erase-gate-side device regions 402a when viewed in cross section.

Figure 10B:
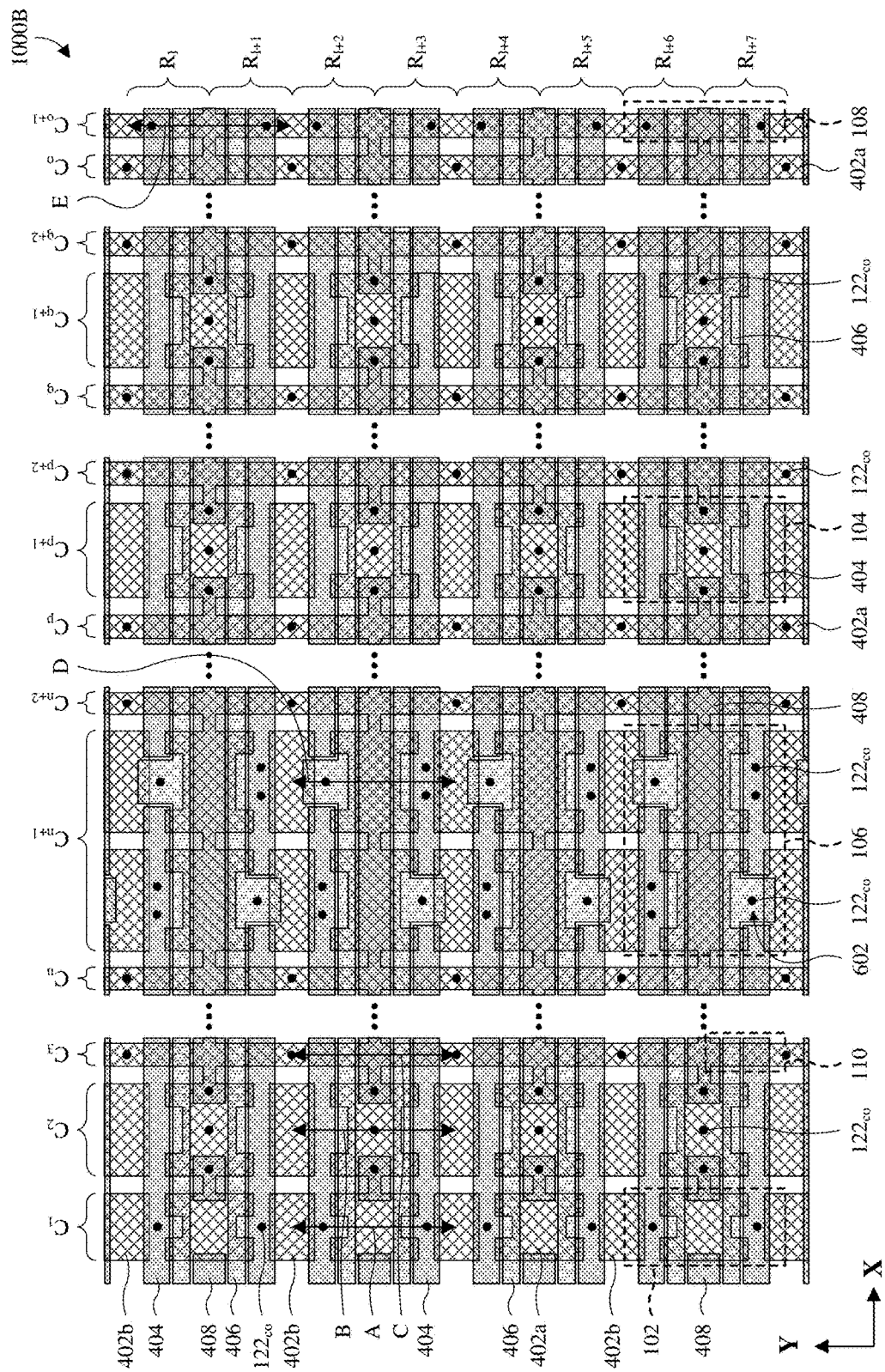

With specific reference to the top layout 1000B of FIG. 10B, the isolation structure 410 and the source lines 504 in FIG. 10A are omitted. Further, a plurality of word lines 404, a plurality of control gates 406, and a plurality of erase gates 408 are on the erase-gate-side device region 402a and the word-line-side device regions 402b. Note that only some of the word lines 404, only some of the control gates 406, only some of the erase gates 408, and only some of the word-line-side device regions 402b are labeled.

The word lines 404, the control gates 406, and the erase gates 408 are elongated in parallel along corresponding rows and partially define the various cells (e.g., the CGWL strap cells 106). At the boundary cells 102 and the SLEG strap cells 104, the erase gates 408 have discontinuities along respective lengths. At the CGWL strap cells 106, the control gates 406 have pad regions 602 protruding through the word lines 404 and introducing discontinuities into the word lines 404. Note that only one of the pad regions 602 is labeled. The word lines 404, the control gates 406, and the erase gates 408 are electrically coupled to corresponding strap lines by the contact vias $122_{co}$. Further, select regions of the erase-gate-side device region 402a are electrically coupled to corresponding strap and bit lines by the contact vias $122_{co}$. Note that only some of the contact vias $122_{co}$ are labeled.

Figure 10C:
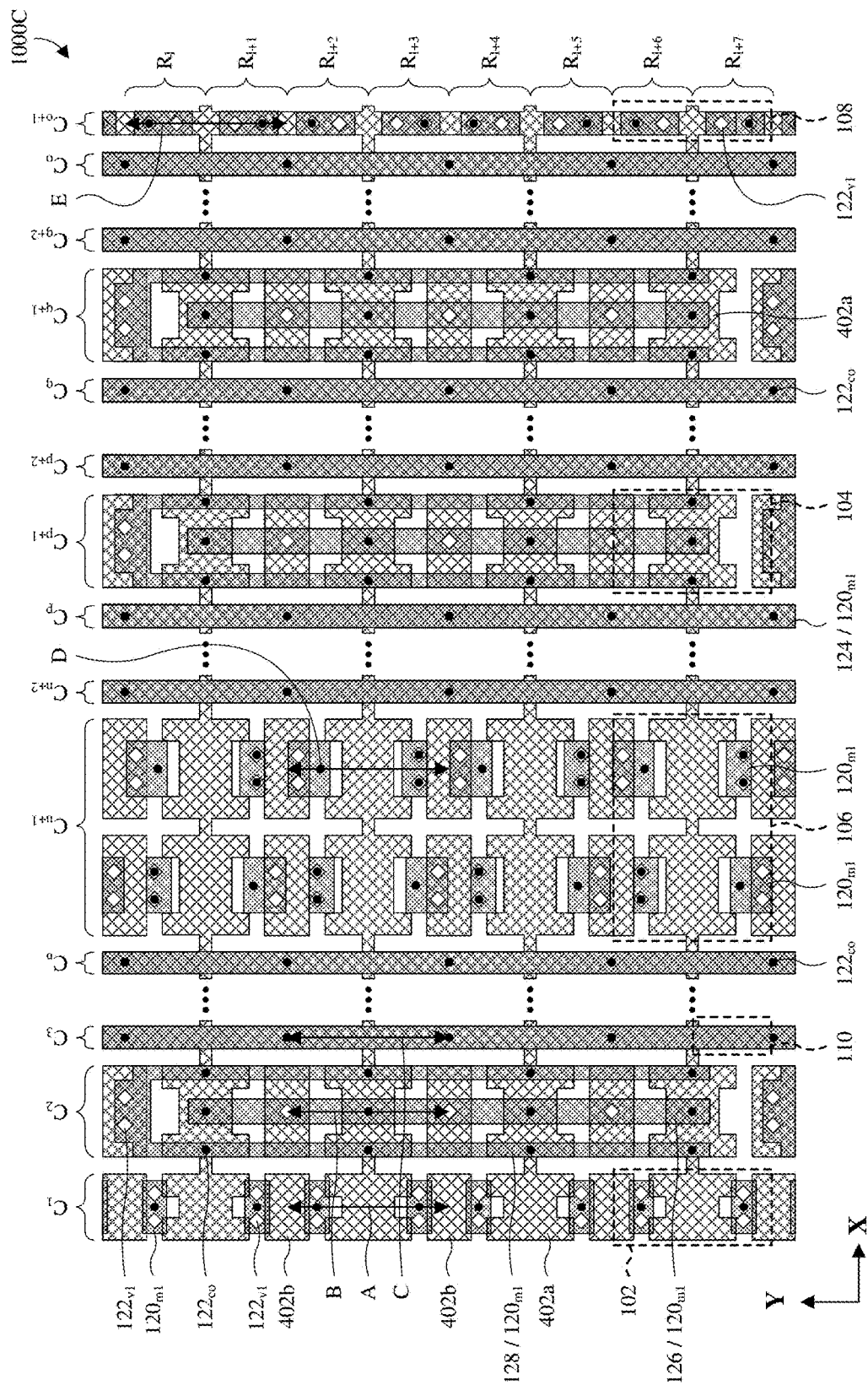

With specific reference to the top layout 1000C of FIG. 10C, the word lines 404 of FIG. 10B, the control gates 406 of FIG. 10B, and the erase gates 408 of FIG. 10B are omitted. Further, a plurality of first-level wires $120_{m1}$ and a plurality of first-level vias $122_{v1}$ are on the on the erase-gate-side device region 402a and the word-line-side device regions 402b. Note that only some of the first-level wires $120_{m1}$, only some of the first-level vias $122_{v1}$, and only some of the word-line-side device regions 402b are labeled.

The first-level wires $120_{m1}$ electrically couple to underlying structure (when viewed in cross section) through the contact vias $122_{co}$ and electrically couple to overlying wires (when viewed in cross section) through the first-level vias $122_{v1}$. The first-level wires $120_{m1}$ comprise a plurality of source-line shunt wires 126 and a plurality of erase-gate shunt wires 128. Note that only one of the source-line shunt wires 126 and only one of the erase-gate shunt wires 128 are labeled. The source-line and erase-gate shunt wires 126, 128 extend along columns at which the SLEG strap cells 104 are located (e.g., column $C_2$) and repeat along the columns at each memory page (only one of which is shown). By repeating along the columns at each memory page, the source-line and erase-gate shunt wires 126, 128 facilitate electrical coupling of the source lines 504 of FIG. 10A and the erase gates 408 of FIG. 10B to corresponding source-line strap lines and corresponding erase-gate strap lines on a memory-page-by-memory-page basis.

Figure 10D:
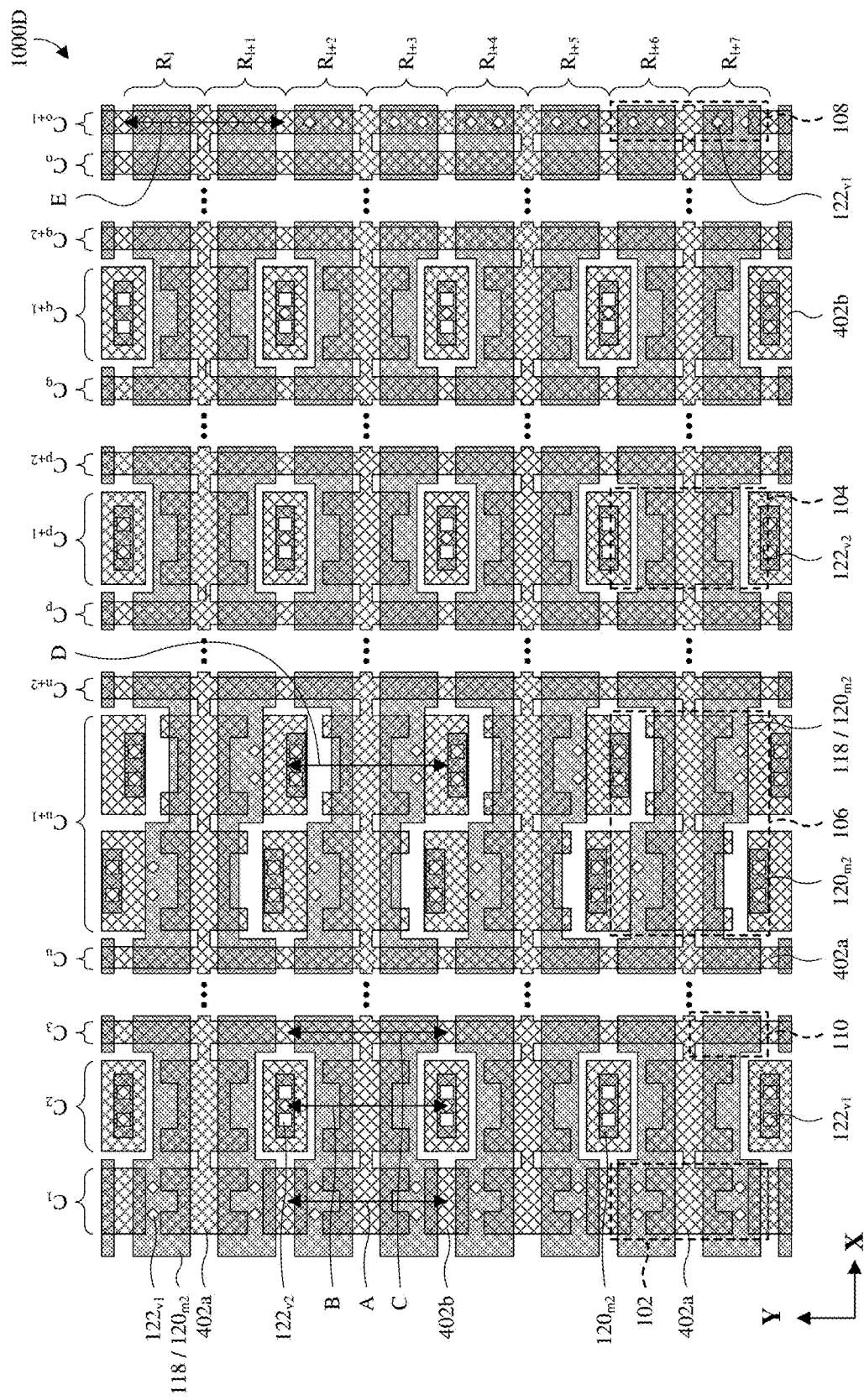

With specific reference to the top layout 1000D of FIG. 10D, the first-level wires $120_{m1}$ of FIG. 10C and the contact vias $122_{co}$ of FIG. 10C are omitted. Further, a plurality of second-level wires $120_{m2}$ and a plurality of second-level vias $122_{v2}$ are on the on the erase-gate-side device region 402a and the word-line-side device regions 402b. Note that only some of the second-level wires $120_{m2}$, only some of the second-level vias $122_{v2}$, and only some of the word-line-side device regions 402b are labeled.

The second-level wires $120_{m2}$ electrically couple to underlying wires (when viewed in cross section) through the first-level vias $122_{v1}$ and electrically couple to overlying wires (when viewed in cross section) through the second-level vias $122_{v2}$. The second-level wires $120_{m2}$ comprise a plurality of word-line strap lines 118. Note that only some of the word-line strap lines 118 are labeled. The word-line strap lines 118 are elongated along corresponding rows and electrically couple respectively to the word lines 404 of FIG. 10B.

Figure 10E:
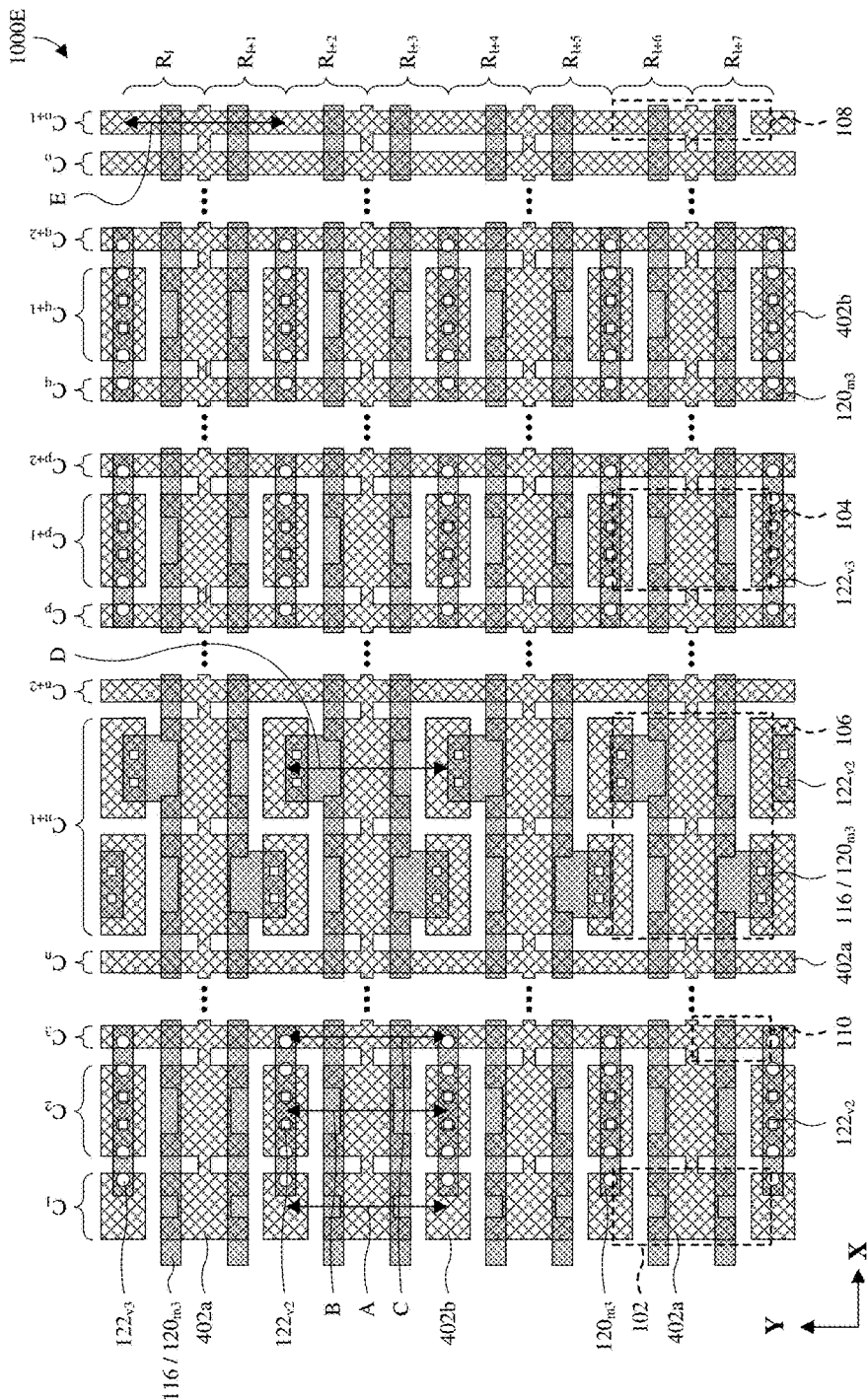

With specific reference to the top layout 1000E of FIG. 10E, the second-level wires $120_{m2}$ of FIG. 10D and the first-level vias $122_{v1}$ of FIG. 10D are omitted. Further, a plurality of third-level wires $120_{m3}$ and a plurality of third-level vias $122_{v3}$ are on the on the erase-gate-side device region 402a and the word-line-side device regions 402b. Note that only some of the third-level wires $120_{m3}$, only some of the third-level vias $122_{v3}$, and only some of the word-line-side device regions 402b are labeled.

The third-level wires $120_{m3}$ electrically couple to underlying wires (when viewed in cross section) through the second-level vias $122_{v2}$ and electrically couple to overlying wires (when viewed in cross section) through the third-level vias $122_{v3}$. The third-level wires $120_{m3}$ comprise a plurality of control-gate strap lines 116. Note that only some of the control-gate strap lines 116 are labeled. The control-gate strap lines 116 are elongated along corresponding rows and electrically couple respectively to the control gates 406 of FIG. 10B.

Figure 10F:
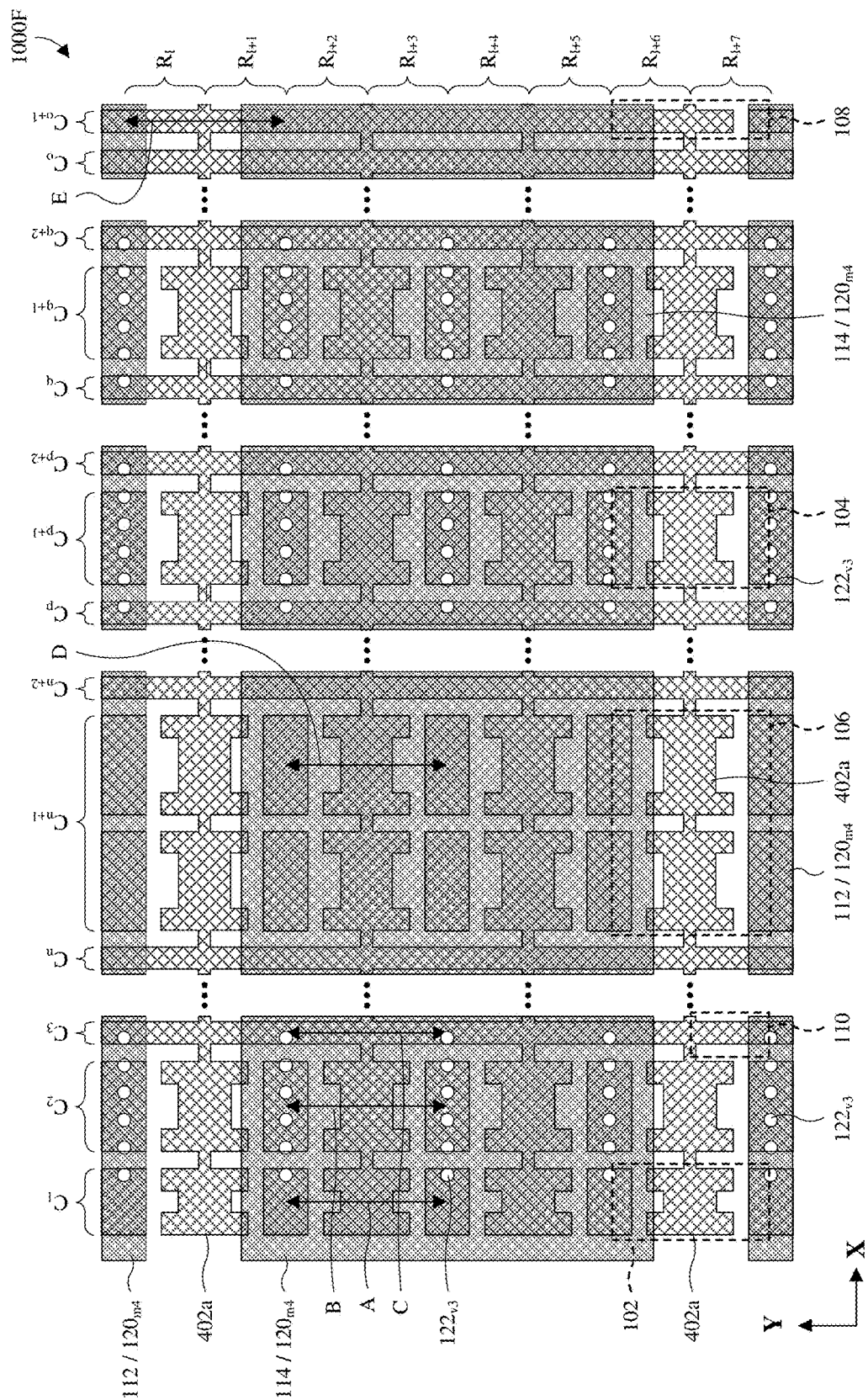
Figure 11A:
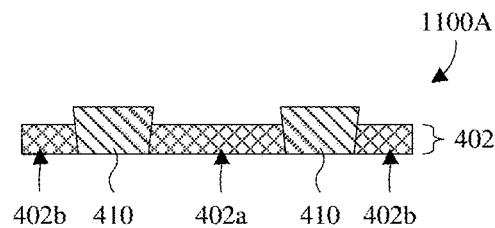
FIGS. 11A-11D through FIGS. 20A-20D illustrate a series of cross-sectional views of some embodiments of a method for forming an integrated chip comprising a memory array with an enhanced strap-cell architecture.
Figure 11B:
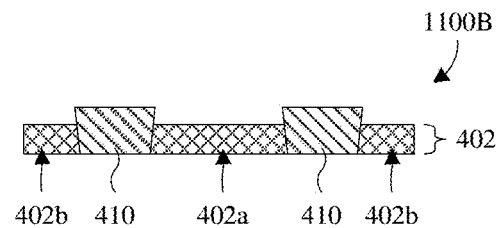
Figure 11C:
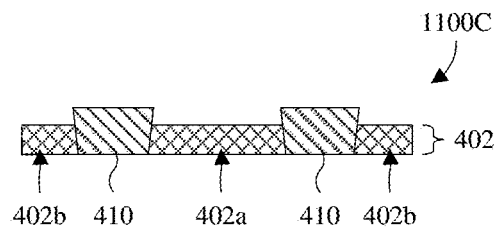
Figure 11D:
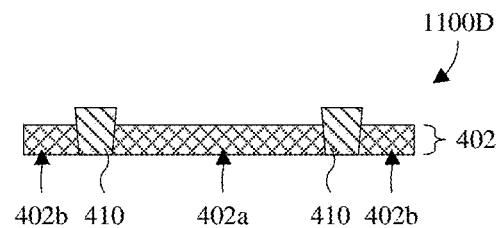

With specific reference to the top layout 1000F of FIG. 10F, the third-level wires $120_{m3}$ of FIG. 10E and the second-level vias $122_{v2}$ of FIG. 10E are omitted. Further, a plurality of fourth-level wires $120_{m4}$ are on the on the erase-gate-side device region 402a and the word-line-side device regions 402b. Note that only some of the fourth-level wires $120_{m4}$ are labeled, Further, the word-line-side device regions 402b are not labeled in FIG. 10F because the word-line-side device regions 402b are covered by the fourth-level wires $120_{m4}$.

The fourth-level wires $120_{m4}$ electrically couple to underlying wires (when viewed in cross section) through the third-level vias $122_{v3}$. The fourth-level wires $120_{m4}$ comprise a plurality of source-line strap lines 112 and an erase-gate strap line 114. The source-line strap lines 112 are individual to memory pages and electrically couple to corresponding source-line shunt wires 126 (see FIG. 10C) in the individual memory pages. Similarly, the erase-gate strap line 114 is individual to a memory page and electrically couples to corresponding erase-gate shunt wires 128 (see FIG. 10C) in the individual memory page.

With reference to FIGS. 11A-11D through FIGS. 20A-20D, a series of cross-sectional views, 1100A-1100D through 2000A-2000D, of some embodiments of a method for forming an integrated chip comprising a memory array with an enhanced strap-cell architecture is provided. The method may, for example, be used to form the integrated chip(s) from any one or combination of FIGS. 1-3, 4A, 4B, 5A-5C, 6A, 6B, 7A, 7B, 8A, 8B, 9A, 9B, and 10A-10F.

Amongst FIGS. 11A-11D through FIGS. 20A-20D, figures with a suffix of "A" may, for example, correspond to the boundary cells 102 in any one or combination of FIGS. 1-3, 4A, 4B, 5A, and 10A-10F and/or may, for example, be taken along line A in any one or combination of FIGS. 4A, 4B, and 10A-10F. Figures with a suffix of "B" may, for example, correspond to the SLEG strap cells 104 in any one or combination of FIGS. 1-3, 4A, 4B, 5B, and 10A-10F and/or may, for example, be taken along line B in any one or combination of FIGS. 4A, 4B, and 10A-10F. Figures with a suffix of "C" may, for example, correspond to the CGWL strap cells 106 in any one or combination of FIGS. 1-3, 6A, 6B, 7A, 7B, and 10A-10F and/or may, for example, be taken along line D in any one or combination of FIGS. 6A, 6B, and 10A-10F. Figures with a suffix of "D" may, for example, correspond to the word-line strap cells 108 in any one or combination of FIGS. 1-3, 8A, 8B, 9A, 9B, and 10A-10F and/or may, for example, be taken along line E in any one or combination of FIGS. 8A, 8B, and 10A-10F.

As illustrated by the cross-sectional views 1100A-1100D of FIGS. 11A-11D, an isolation structure 410 is formed in a substrate 402, demarcating an erase-side device region 402a and a pair of word-line-side device regions 402b. The erase-side device region 402a, the word-line-side device regions 402b, and the isolation structure 410 have top layouts as illustrated in any one or combination of FIGS. 4A, 4B, 6A, 6B, 8A, 8B, and 10A-10F. In some embodiments, a process for forming the isolation structure 410 comprises: 1) depositing a pad oxide layer on the substrate 402; 2) depositing a pad nitride layer on the pad oxide layer; 3) patterning the pad oxide and nitride layers with a layout of the isolation structure 410; 4) performing an etch into the substrate 402 with the pad oxide and nitride layers in place to form isolation openings; 5) filling the isolation openings with a dielectric material; and 6) removing the pad oxide and nitride layers. Other processes are, however, amenable.

As illustrated by the cross-sectional views 1200A-1200D of FIGS. 12A-12D, a first dielectric layer 1202 and a first conductive layer 1204 (also known as a floating gate layer) are formed stacked on the substrate 402, between segments of the isolation structure 410. A process for forming the first dielectric layer 1202 and the first conductive layer 1204 may, for example, comprise: 1) depositing the first dielectric layer 1202 on the substrate 402; 2) depositing the first conductive layer 1204 on the first dielectric layer 1202 and the isolation structure 410; and 3) performing a planarization into the first conductive layer 1204 until the isolation structure 410 is reached. Other processes are, however, amenable. The depositing of the first dielectric layer 1202 may, for example, be performed by thermal oxidation and/or some other suitable deposition process(es). The depositing of the first conductive layer 1204 may, for example, be performed by vapor deposition and/or some other suitable deposition process(es).

Also illustrated by the cross-sectional views 1200A-1200D of FIGS. 12A-12D, a second dielectric layer 1206, a second conductive layer 1208 (also known as a control gate layer), and a hard mask layer 1210 are formed stacked over the first conductive layer 1204 and the isolation structure 410. The second dielectric layer 1206 and the hard mask layer 1210 may, for example, be or comprise silicon oxide, silicon nitride, some other suitable dielectric(s), or any combination of the foregoing. In some embodiments, the second dielectric layer 1206 is or comprises an oxide-nitride-oxide (ONO) film and/or the hard mask layer 1210 is or comprise an ONO film. The second conductive layer 1208 may be or comprise, for example, doped polysilicon and/or some other suitable conductive material(s).

Figure 12A:
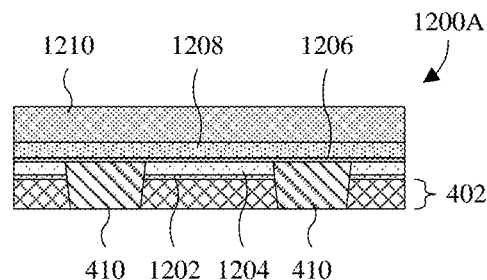
Figure 12B:
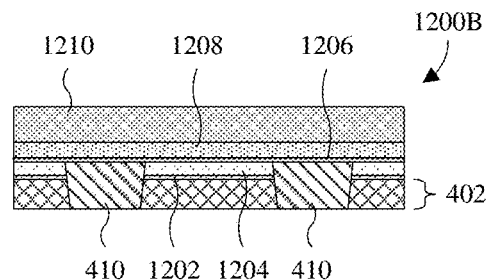
Figure 12C:
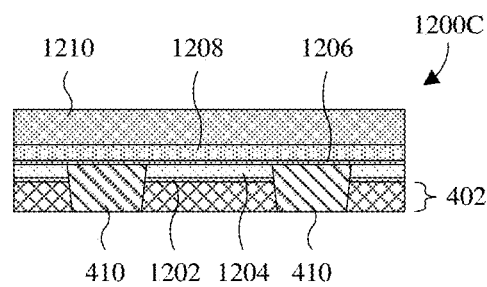
Figure 12D:
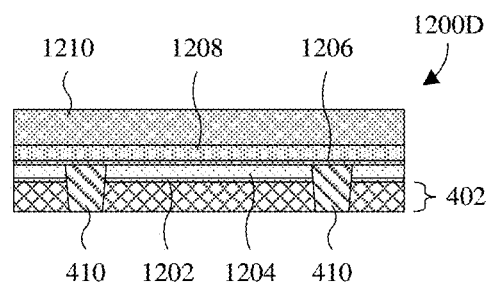
Figure 13A:
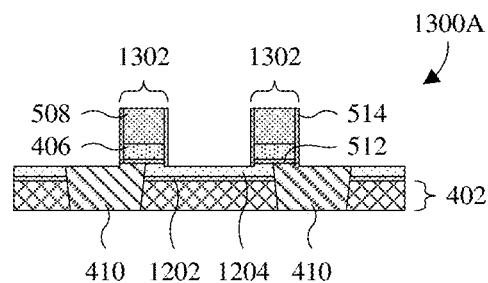
Figure 13B:
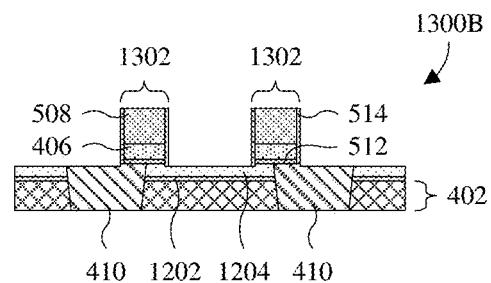
Figure 13C:
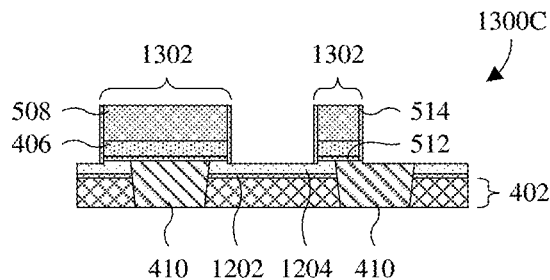
Figure 13D:
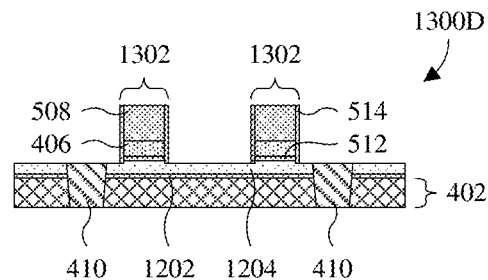
Figure 14A:
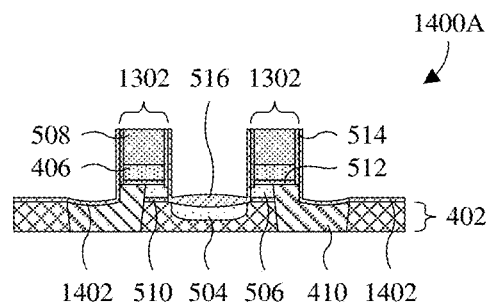
Figure 14B:
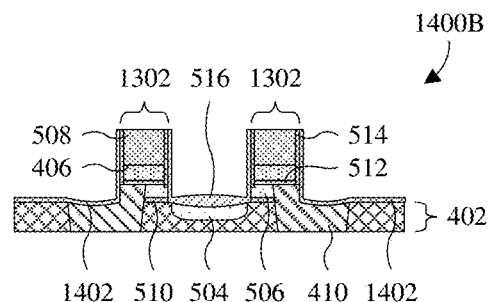
Figure 14C:
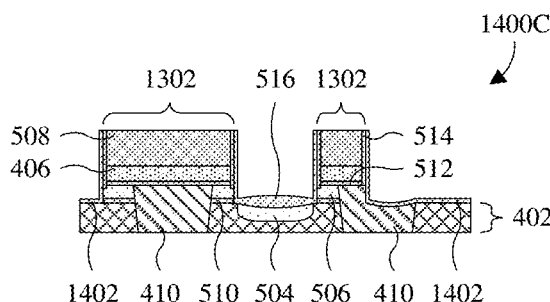
Figure 14D:
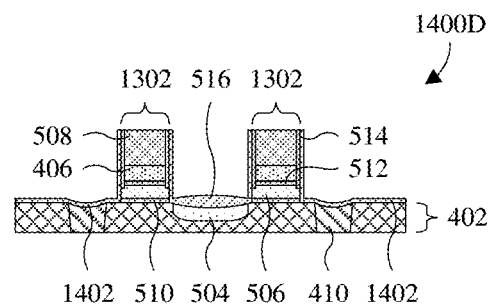
Figure 15A:
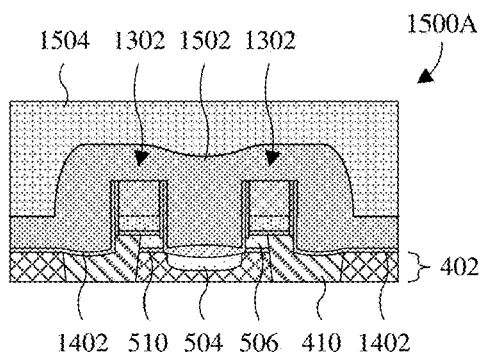
Figure 15B:
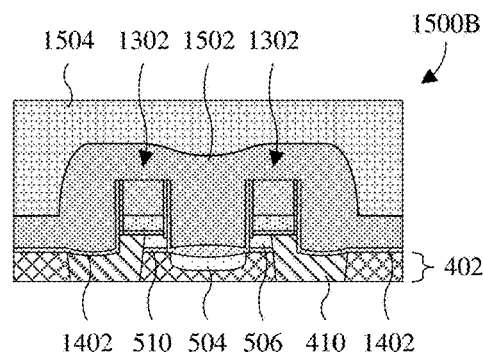
Figure 15C:
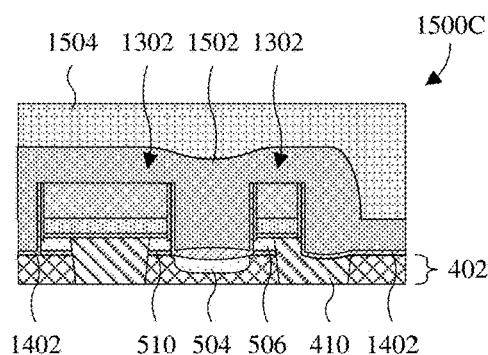
Figure 15D:
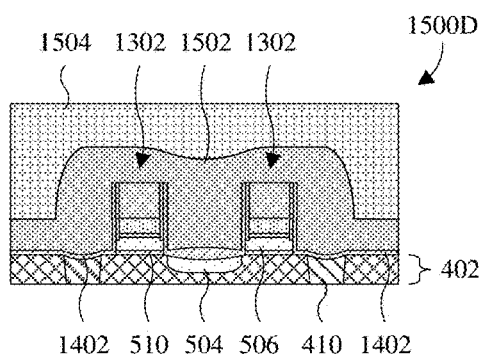
Figure 16A:
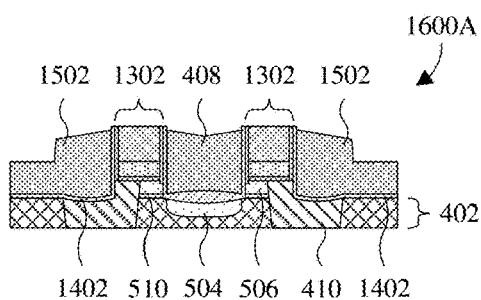
Figure 16B:
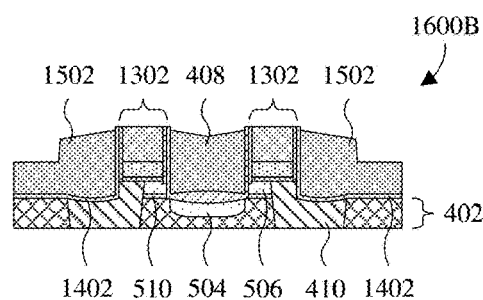
Figure 16C:
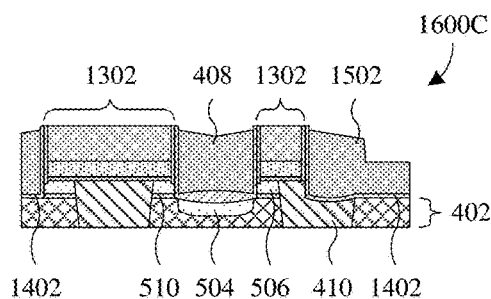
Figure 16D:
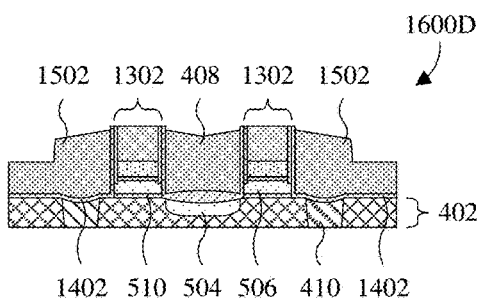
Figure 17A:
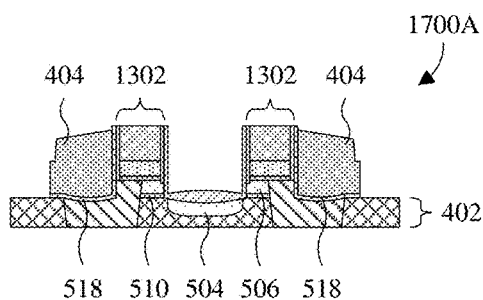
Figure 17B:
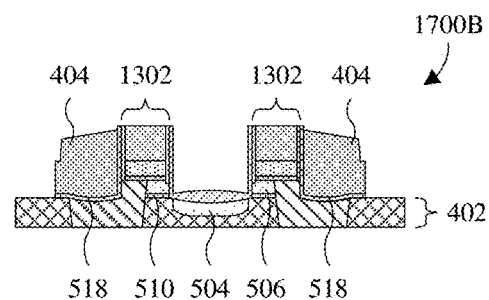
Figure 17C:
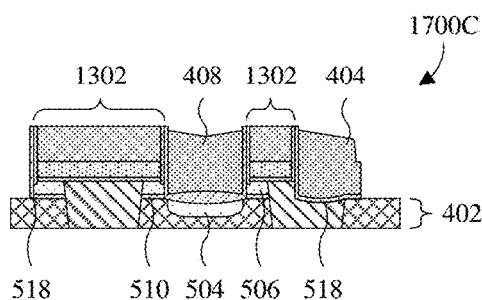
Figure 17D:
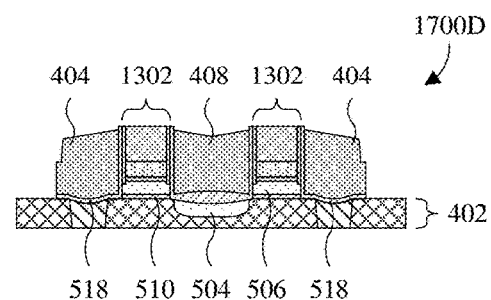
Figure 18A:
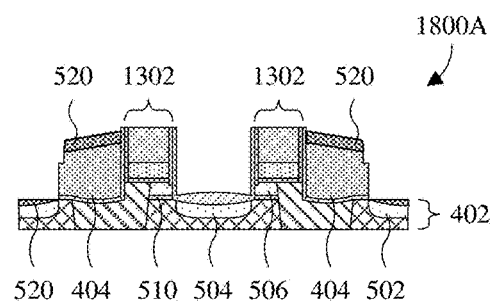
Figure 18B:
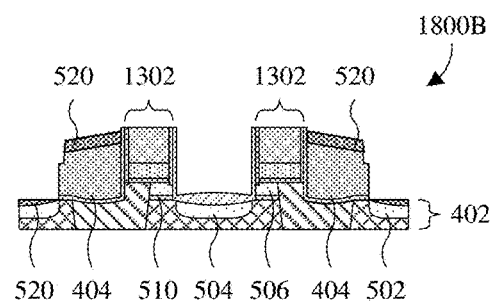
Figure 18C:
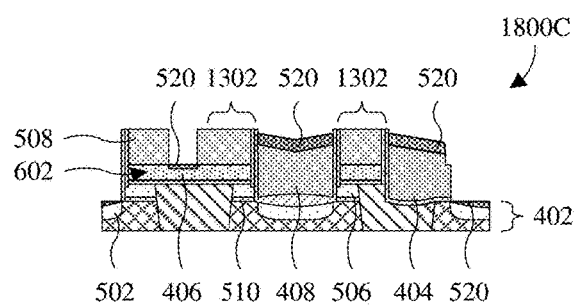
Figure 18D:
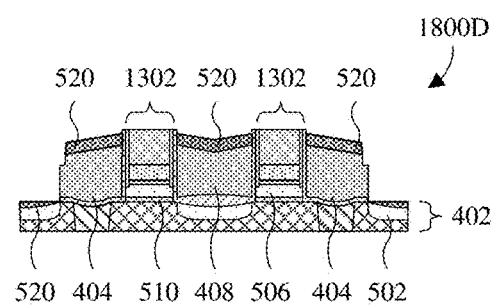
Figure 19A:
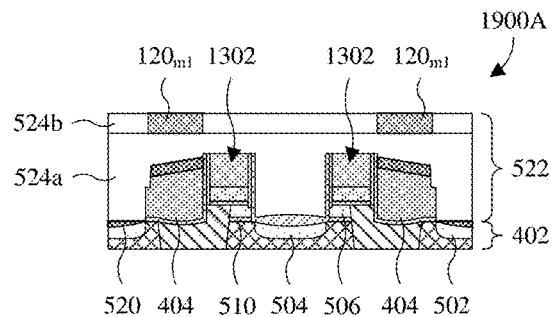
Figure 19B:
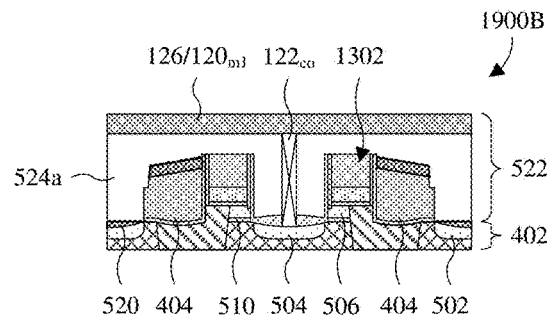
Figure 19C:
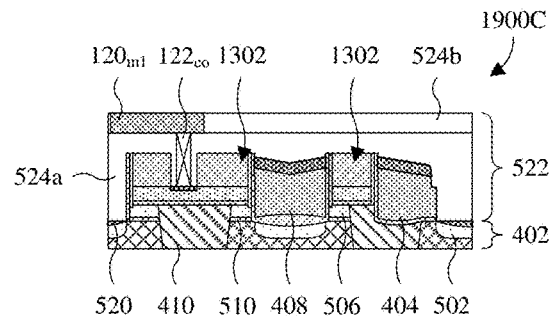
Figure 19D:
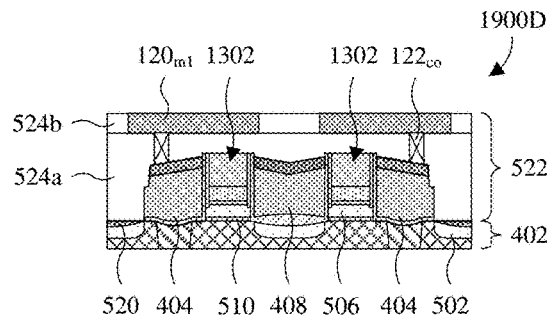
Figure 20A:
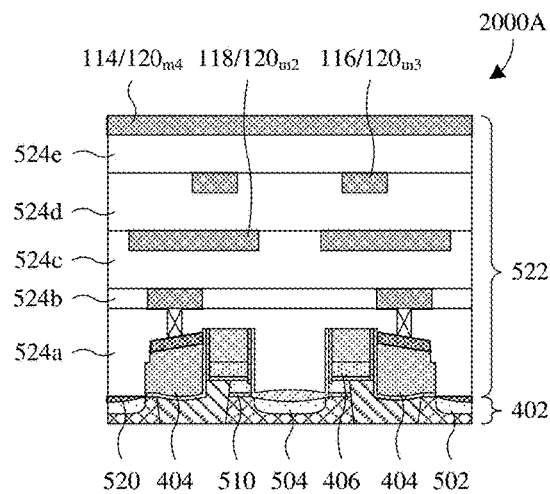
Figure 20B:
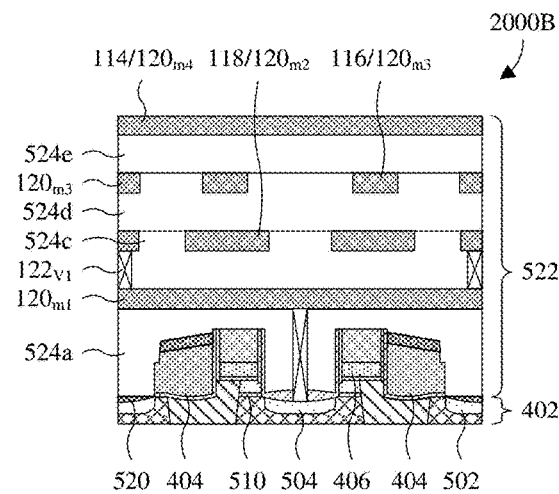
Figure 20C:
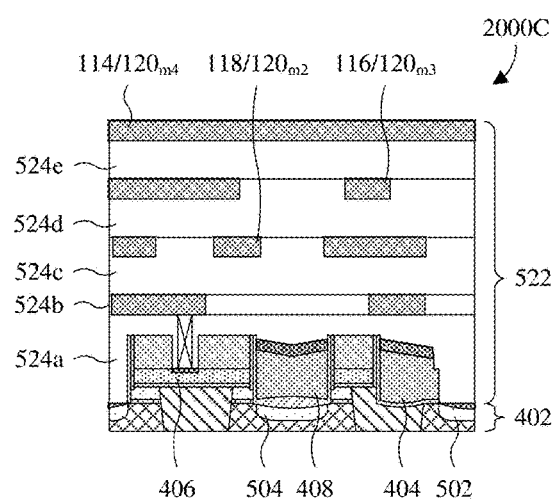
Figure 20D:
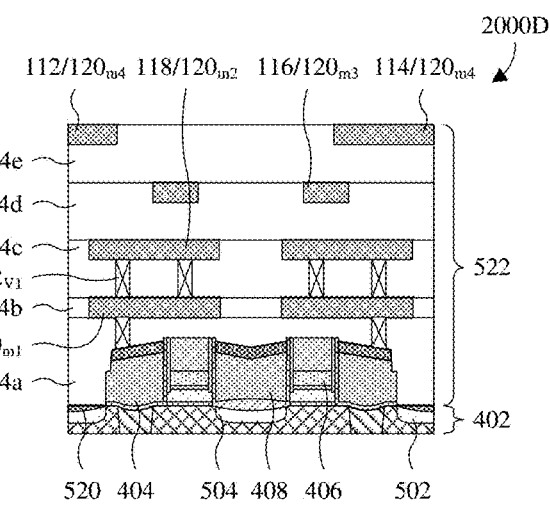

As illustrated by the cross-sectional views 1300A-1300D of FIGS. 13A-13D, a plurality of control-gate stacks 1302 is formed from the second dielectric layer 1206 (see FIGS. 12A-12D), the second conductive layer 1208 (see FIGS. 12A-12D), and the hard mask layer 1210 (see FIGS. 12A-

12D). The control-gate stacks 1302 comprise individual control-gate dielectric layers 512, individual control gates 406, and individual control-gate hard masks 508. The control gates 406 respectively overlie the control-gate dielectric layers 512, and the control-gate hard masks 508 respectively overlie the control gates 406. The control-gate stacks 1302 may, for example, have the same top layout as the plurality of control gates 406 in any one or combination of FIGS. 4A, 4B, 6A, 6B, 8A, 8B, and 10B. Other top layouts are, however, amenable.

In some embodiments, a process for forming the control-gate stacks 1302 comprises: 1) patterning the hard mask layer 1210 with a control-gate pattern; and 2) performing an etch into the second dielectric layer 1206 and the second conductive layer 1208 with the hard mask layer 1210 in place to transfer the control-gate pattern. Other processes for forming control-gate stacks 1302 are, however, amenable. The patterning may, for example, be performed by a photolithography/etching process or some other suitable patterning process.

Also illustrated by the cross-sectional views 1300A-1300D of FIGS. 13A-13D, control-gate sidewall spacers 514 are formed on sidewalls of the control-gate stacks 1302. The control-gate sidewall spacers 514 may, for example, be or comprise silicon oxide, silicon nitride, some other suitable dielectric(s), or any combination of the foregoing. In some embodiments, the control-gate sidewall spacers 514 are or comprise an ONO film. In some embodiments, a process for forming the control-gate sidewall spacers 514 comprises: 1) depositing a sidewall spacer layer covering and lining the control-gate stacks 1302; and 2) performing an etch back into the sidewall spacer layer. Other processes are, however, amenable.

As illustrated by the cross-sectional views 1400A-1400D of FIGS. 14A-14D, floating gates 506 and floating-gate dielectric layers 510 are formed respectively from the first conductive layer 1204 (see FIGS. 13A-13D) and the first dielectric layer 1202 (see FIGS. 13A-13D). The floating gates 506 respectively underlie the control gates 406, and the floating-gate dielectric layers 510 respectively underlie the floating gates 506. In some embodiments, a process for forming the floating gates 506 and the floating-gate dielectric layers 510 comprises performing an etch into the first conductive layer 1204 and the first dielectric layer 1202 using the control-gate sidewall spacers 514 and the control-gate hard masks 508 as a mask. Other processes are, however, amenable.

Also illustrated by the cross-sectional views 1400A-1400D of FIGS. 14A-14D, a third dielectric layer 1402 (also known as a gate dielectric layer) is formed on sidewalls of the control-gate sidewall spacers 514 and sidewalls of the floating gates 506. Further, the third dielectric layer 1402 is formed lining the substrate 402 and the isolation structure 410 to sides of the control-gate stacks 1302. The third dielectric layer 1402 defines an erase-gate dielectric layer 516 that is between the control-gate stacks 1302 and that will border an erase gate (not yet formed). The third dielectric layer 1402 may be or comprise, for example, silicon oxide and/or some other suitable dielectric(s).

A process for forming the third dielectric layer 1402 may, for example, comprise: 1) depositing a first dielectric portion of the third dielectric layer 1402 covering and lining the control-gate stacks 1302; 2) etching back the first dielectric portion; and 3) depositing a second dielectric portion of the third dielectric layer 1402 on the substrate 402. Other processes are, however, amenable. The first dielectric portion may, for example, be formed by vapor deposition and/or some other suitable deposition process(es), and/or the second dielectric portion may, for example, be formed by thermal oxidation and/or some other suitable deposition process(es).

Also illustrated by the cross-sectional views 1400A-1400D of FIGS. 14A-14D, a source line 504 is formed in the substrate 402, between the control-gate stacks 1302. The source line 504 is doped portions of the substrate 402 having an opposite doping type as adjoining portions of the substrate 402. The source line 504 may, for example, have the top layout of any one of the source lines 504 in FIG. 10A or some other suitable top layout. Formation of the source line 504 may, for example, be performed before, during, or after formation of the third dielectric layer 1402 and/or may, for example, be performed by ion implantation and/or some other suitable doping process(es).

As illustrated by the cross-sectional views 1500A-1500D of FIGS. 15A-15D, a third conductive layer 1502 (also known as a gate layer) and an antireflective layer 1504 are formed stacked over and covering the substrate 402 and the control-gate stacks 1302. The third conductive layer 1502 is indented at sides of the control-gate stacks 1302 due to the change in elevation and may, for example, be or comprise doped polysilicon and/or some other suitable conductive material. The third conductive layer 1502 may, for example, be or comprise doped polysilicon and/or some other suitable conductive material. The antireflective layer 1504 may, for example, be or comprise a bottom antireflective coating (BARC) material and/or some other suitable antireflective material.

As illustrated by the cross-sectional views 1600A-1600D of FIGS. 16A-16D, the third conductive layer 1502 and the antireflective layer 1504 (see FIGS. 15A-15D) are recessed to below top surfaces of the control-gate stacks 1302, and the antireflective layer 1504 is subsequently removed. The recessing forms an erase gate 408 from the third conductive layer 1502. The erase gate 408 covers the source line 504 and may, for example, have the same top layout as any one of the erase gates 408 in FIGS. 4A, 4B, 6A, 6B, 8A, 8B, and 10B. Other top layouts are, however, amenable. The recessing may, for example, be performed by an etch back and/or some other suitable process(es). The etch back may, for example, comprise: 1) etching the antireflective layer 1504 until the third conductive layer 1502 is uncovered; and 2) simultaneously etching the third conductive layer 1502 and the antireflective layer 1504 until the top surface of the third conductive layer 1502 is recessed to below the top surfaces of the control-gate stacks 1302.

As illustrated by the cross-sectional views 1700A-1700D of FIGS. 17A-17D, the third dielectric layer 1402 (see FIGS. 16A-16D) and the third conductive layer 1502 (see FIGS. 16A-16D) are patterned to form word lines 404 and word-line dielectric layers 518. The word lines 404 are formed along sidewalls of the control-gate stacks 1302, and the word-line dielectric layers 518 line the word lines 404. Further, a portion of the erase gate 408 (see FIGS. 16A-16D) is removed from the boundary cell (i.e., FIG. 17A) and the SLEG strap cell (i.e., FIG. 17B). The word lines 404 may, for example, have the same top layout as any one of the word lines 404 in FIGS. 4A, 4B, 6A, 6B, 8A, 8B, and 10B. Other top layouts are, however, amenable. The patterning may, for example, be performed by a photolithography/etching process or some other suitable patterning process.

As illustrated by the cross-sectional views 1800A-1800D of FIGS. 18A-18D, a control-gate hard mask 508 is patterned at the CGWL strap cell (i.e., FIG. 18C) to form a contact opening exposing a pad region 602 of a control gate 406. The patterning may, for example, be performed by a photolithography/etching process and/or some other suitable patterning process(es).

Also illustrated by the cross-sectional views 1800A-1800D of FIGS. 18A-18D, source/drain regions 502 are formed in the substrate 402, adjacent to the word lines 404. The source/drain regions 502 may, for example, be doped regions of the substrate 402 having an opposite doping type as adjoining regions of the substrate 402.

Also illustrated by the cross-sectional views 1800A-1800D of FIGS. 18A-18D, silicide layers 520 are formed respectively covering the word lines 404, the erase gate 408, and the source/drain regions 502. The silicide layers 520 may, for example, be or comprise nickel silicide and/or some other suitable silicide.

As illustrated by the cross-sectional views 1900A-1900D of FIGS. 19A-19D, an interconnect structure 522 is partially formed over the word lines 404, the erase gate 408, and the control-gate stacks 1302. The interconnect structure 522 comprises an inter-layer dielectric (ILD) layer 524a, and further comprises a first inter-metal dielectric (IMD) layer 524b overlying the ILD layer 524a. Further, the interconnect structure 522 comprises a plurality of first-level wires $120_{m1}$ and a plurality of contact vias $122_{co}$. The plurality of contact vias $122_{co}$ and the plurality of first-level wires $120_{m1}$ are respectively in the ILD layer 524a and the first IMD layer 524b, and the contact vias $122_{co}$ extend from the first-level wires $120_{m1}$ to the strap cells. In some embodiments, the plurality of first-level wires $120_{m1}$ comprises a source-line shunt wire 126 at the SLEG strap cell (i.e., FIG. 19B). The source-line shunt wire 126 may, for example, have a top layout as illustrated in FIG. 10C.

In some embodiments, a process for partially forming the interconnect structure 522 comprises: 1) forming the contact vias $122_{co}$ by a single damascene process; and 2) subsequently forming the first-level wires $120_{m1}$ by the single damascene process. Other processes for forming the interconnect structure 522 are, however, amenable. In some embodiments, the single damascene process comprises: 1) depositing a dielectric layer (e.g., the ILD layer 524a or the first IMD layer 524b); 2) patterning the dielectric layer with openings for a single level of conductive features (e.g., a level of vias or a level of wires); 3) and filling the openings with conductive material to form the single level of conductive features.

As illustrated by the cross-sectional views 2000A-2000D of FIGS. 20A-20D, the interconnect structure 522 is expanded. The interconnect structure 522 comprises a second IMD layer 524c, a third IMD layer 524d, and a fourth IMD layer 524e stacked over the first IMD layer 524b. Further, the interconnect structure 522 comprises a plurality of wires and a plurality of vias in the second, third, and fourth IMD layers 524b-524d. A plurality of second-level wires $120_{m2}$, a plurality of third-level wires $120_{m3}$, and a plurality of fourth-level wires $120_{m4}$ are respectively in the second, third, and fourth IMD layers 524b-524d. A plurality of first-level vias $122_{v1}$ is in the second IMD layer 524c and extends from the second-level wires $120_{m2}$ to the first-level wires $120_{m1}$. The plurality of second-level wires $120_{m2}$ comprises word-line strap lines 118 respectively overlying and electrically coupled to the word lines 404 by underlying wires and vias. The word-line strap lines 118 may, for example, have top layouts as shown in FIG. 10D or some other suitable top layouts. The plurality of third-level wires $120_{m3}$ comprises control-gate strap lines 116 respectively overlying and electrically coupled to the control gates 406 by underlying wires and vias. The control-gate strap lines 116 may, for example, have top layouts as shown in FIG. 10E or some other suitable top layouts. The plurality of fourth-level wires $120_{m4}$ comprises an erase-gate strap line 114 and a source-line strap line 112 respectively overlying and electrically coupled to the erase gate 408 and the source line 504 by underlying wires and vias. The erase-gate strap line 114 and the source-line strap line 112 may, for example, have top layouts as shown in FIG. 10F or some other suitable top layouts.

In some embodiments, a process for expanding the interconnect structure 522 comprises: 1) forming the first-level vias $122_{v1}$ and the second-level wires $120_{m2}$ by a dual damascene process; 2) forming the third-level wires $120_{m3}$ and corresponding vias (not shown) by a dual damascene process; and 3) forming the fourth-level wires $120_{m4}$ and corresponding vias (not shown) by a dual damascene process. Other processes for expanding the interconnect structure 522 are, however, amenable. In some embodiments, the dual damascene process comprises: 1) depositing a dielectric layer (e.g., the second, third, or fourth IMD layers 524b-524d); 2) patterning the dielectric layer with openings for two levels of conductive features (e.g., a level of vias and a level of wires); 3) and filling the openings with conductive material to form the two levels of conductive features.

While FIGS. 11A-11D through FIGS. 20A-20D are described with reference to a method, it will be appreciated that the structures shown in FIGS. 11A-11D through FIGS. 20A-20D are not limited to the method but rather may stand alone separate of the method. Further, while FIGS. 11A-11D through FIGS. 20A-20D are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 21:
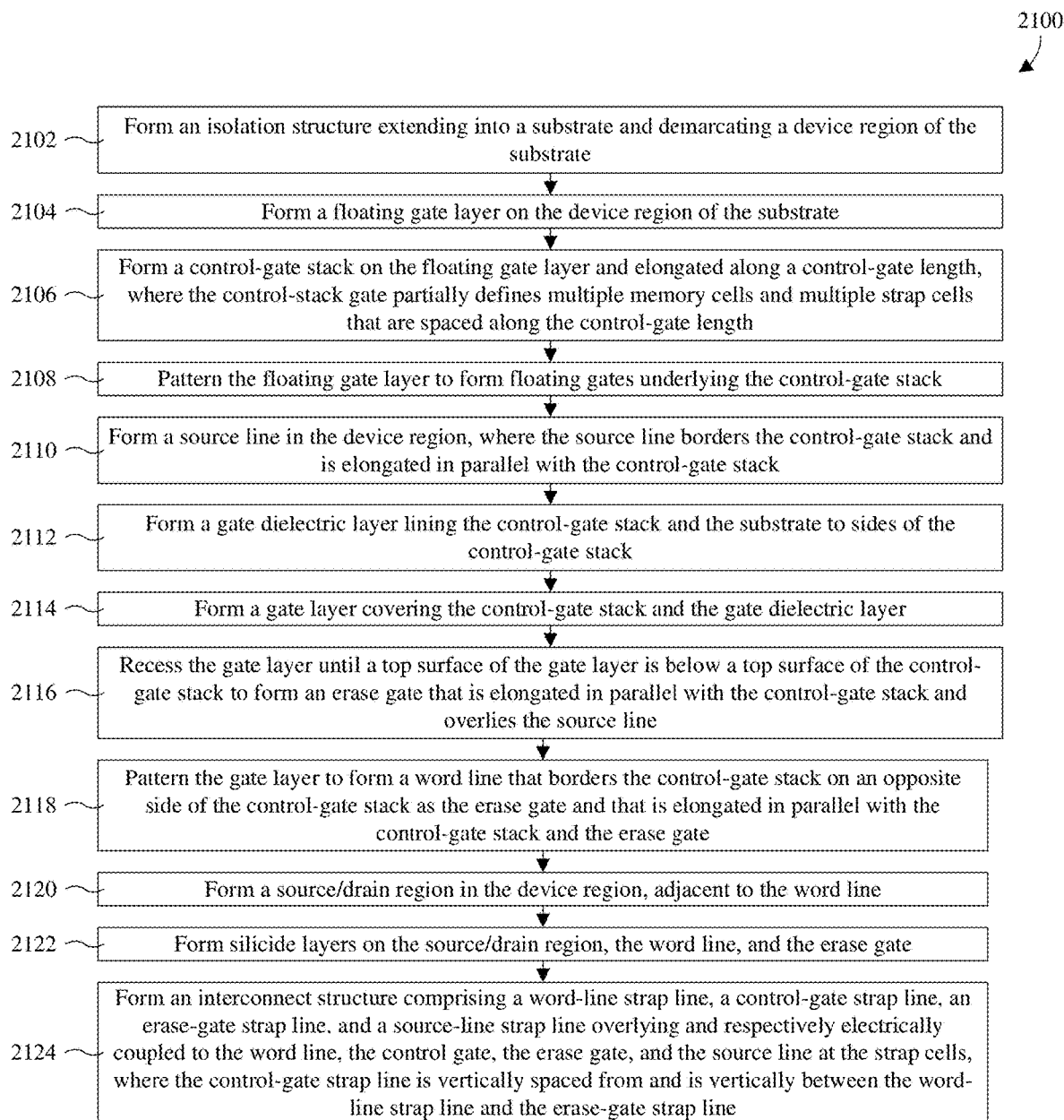
FIG. 21 illustrates a block diagram of some embodiments of the method of FIGS. 11A-11D through FIGS. 20A-20D.

With reference to FIG. 21, a block diagram 2100 of some embodiments of the method of FIGS. 11A-11D through FIGS. 20A-20D is provided.

At 2102, an isolation structure is formed extending into a substrate and demarcating a device region of the substrate. See, for example, FIGS. 11A-11D.

At 2104, a floating gate layer is formed on the device region of the substrate. See, for example, FIGS. 12A-12D.

At 2106, a control-gate stack is formed on the floating gate layer and elongated along a control-gate length, where the control-stack gate partially defines multiple memory cells and multiple strap cells that are spaced along the control-gate length. See, for example, FIGS. 12A-12D through FIGS. 13A-13D.

At 2108, the floating gate layer is patterned to form floating gates underlying the control-gate stack. See, for example, FIGS. 14A-14D.

At 2110, a source line is formed in the device region, where the source line borders the control-gate stack and is elongated in parallel with the control-gate stack. See, for example, FIGS. 14A-14D.

At 2112, a gate dielectric layer is formed lining the control-gate stack and the substrate to sides of the control-gate stack. See, for example, FIGS. 14A-14D.

At 2114, a gate layer is formed covering the control-gate stack and the gate dielectric layer. See, for example, FIGS. 15A-15D.

At 2116, the gate layer is recessed until a top surface of the gate layer is below a top surface of the control-gate stack to form an erase gate that is elongated in parallel with the control-gate stack and overlies the source line. See, for example, FIGS. 16A-16D.

At 2118, the gate layer is patterned to form a word line that borders the control-gate stack on an opposite side of the control-gate stack as the erase gate and that is elongated in parallel with the control-gate stack and the erase gate. See, for example, FIGS. 17A-17D.

At 2120, a source/drain region is formed in the device region, adjacent to the word line. See, for example, FIGS. 18A-18D.

At 2122, silicide layers are formed on the source/drain region, the word line, and the erase gate. See, for example, FIGS. 18A-18D.

At 2124, an interconnect structure is formed. The interconnect structure comprises a word-line strap line, a control-gate strap line, an erase-gate strap line, and a source-line strap line overlying and respectively electrically coupled to the word line, the control gate, the erase gate, and the source line at the strap cells, where the control-gate strap line is vertically spaced from and is vertically between the word-line strap line and the erase-gate strap line. See, for example, FIGS. 19A-19D through 20A-20D. By vertically spacing the control-gate strap line from the word-line strap line and the erase-gate strap line, the control-gate strap line, the word-line strap line, and the erase-gate strap line are in different metallization layers. This reduces strap-line density (i.e., strap-line spacing is increased), which allows enhanced scaling (e.g., to process node 40 and beyond) and/or allows use of ELK dielectric materials for IMD layers.

While the block diagram 2100 of FIG. 21 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides an integrated chip including: a memory array including multiple cells in multiple rows and multiple columns, wherein the cells include multiple first-type strap cells spaced along a first row of the memory array and further include multiple second-type strap cells spaced along the first row; a word line and a control gate extending along the first row and partially defining cells of the memory array in the first row; a word-line strap line extending along the first row at a first elevation above the memory array and electrically coupled to the word line at the first- and second-type strap cells; and a control-gate strap line extending along the first row at a second elevation above the memory array and electrically coupled to the control gate at the first-type strap cells, but not the second-type strap cells, wherein the first and second elevations are different. In some embodiments, the word line and the control gate include polysilicon, and wherein the word-line and control-gate strap lines include metal. In some embodiments, the first elevation is less than the second elevation. In some embodiments, the cells further include multiple third-type strap cells spaced along the first row, wherein the integrated chip further includes: an erase gate extending along the first row and partially defining the cells of the memory array in the first row; and an erase-gate strap line extending along the first row at a third elevation above the memory array and electrically coupled to the erase gate at the third-type strap cells, but not the first- and second-type strap cells, wherein the first, second, and third elevations are different. In some embodiments, the integrated chip further includes: a substrate including a source line, wherein the source line extends along the first row and partially defines the cells of the memory array in the first row; and a source-line strap line extending along the first row at the third elevation and electrically coupled to the source line at the third-type strap cells, but not the first- and second-type strap cells. In some embodiments, the cells further include multiple third-type strap cells spaced along the first row, wherein the integrated chip further includes: a substrate including a source-line region, wherein the source-line region is elongated along the first row and partially defines the cells of the memory array in the first row; and a source-line strap line extending along the first row at a third elevation above the memory array and electrically coupled to the source-line region at the third-type strap cells, but not the first- and second-type strap cells, wherein the first, second, and third elevations are different. In some embodiments, the word-line strap line electrically couples to the word line at multiple first locations that repeat along the first row with a first frequency, wherein the source-line strap line electrically couples with the source-line region at multiple second locations that are repeat along the first row with a second frequency, and wherein the first frequency is greater than and is an integer multiple of the second frequency. In some embodiments, the cells include multiple memory cells spaced along a first column of the memory array, wherein the integrated chip further includes: a bit line extending along the first column at a third elevation above the memory array and electrically coupled to the memory cells, wherein the first, second, and third elevations are different.

In some embodiments, the present disclosure provides another integrated chip including: a memory array including a plurality of cells in a plurality of rows and a plurality of columns, wherein the plurality of rows includes a first row; an erase gate and a control gate elongated along the first row, wherein the erase and control gates partially define cells of the memory array in the first row; an erase-gate strap line elongated along the first row at a first elevation above the memory array, wherein the erase-gate strap line is electrically coupled to the erase gate at a plurality of first locations along the first row; and a control-gate strap line elongated along the first row at a second elevation above the memory array that is different than the first elevation, wherein the control-gate strap line is electrically coupled to the control gate at a plurality of second locations along the first row. In some embodiments, the first elevation is greater than the second elevation. In some embodiments, the first locations are evenly spaced along the first row and have a first pitch, wherein the second locations are evenly spaced along the first row and have a second pitch less than the first pitch. In some embodiments, the integrated chip further includes: a substrate including a source line, wherein the source line is elongated along the first row and partially defines the cells of the memory array in the first row; and a source-line strap line elongated along the first row at a third elevation above the memory array that is different than the second elevation, and wherein the source-line strap line is electrically coupled to the source line at a plurality of third locations along the first row. In some embodiments, the first locations are spaced along the first row and have a first pitch, wherein the third locations are spaced along the first row and have the first pitch. In some embodiments, the first and third elevations are the same. In some embodiments, the integrated chip further includes: a word line elongated along the first row and partially defining the cells of the memory array in the first row; and a word-line strap line elongated along the first row at a third elevation above the memory array that is different than the first and second elevations, wherein the word-line strap line is electrically coupled to the word line at a plurality of third locations along the first row.

In some embodiments, the present disclosure provides a method for forming an integrated chip, the method including: forming a control gate elongated along a control-gate length, wherein the control gate partially defines multiple memory cells and multiple first-type strap cells that are spaced along the control-gate length; depositing a gate layer covering the control gate; patterning the gate layer to form a word line and an erase gate that are elongated in parallel with the control gate and partially define the memory cells and the first-type strap cells, wherein the control gate is between and borders the word line and the erase gate; and forming multiple control-gate contact vias and multiple word-line contact vias respectively on the control gate and the word line, wherein the control-gate and word-line contact vias are at the first-type strap cells, but not the memory cells. In some embodiments, the control gate is formed with multiple pad regions respectively at the first-type strap cells, but not at the memory cells, wherein the pad regions protrude in a direction transverse to the control-gate length, and wherein the control-gate contact vias are on the control gate respectively at the pad regions. In some embodiments, the control gate, the word line, and the erase gate partially define multiple second-type strap cells that are spaced along the control-gate length, wherein the method further includes: doping a substrate to form a source line that is elongated in parallel with the control gate, wherein the erase gate is formed overlying the source line and has discontinuities respectively at the second-type strap cells; and forming multiple source-line contact vias on the source line and respectively at the second-type strap cells, but not the memory cells and the first-type strap cells. In some embodiments, the method further includes forming multiple pairs of erase-gate contact vias on the erase gate, wherein the pairs are respectively at the second-type strap cells, but not the memory cells and the first-type strap cells, and wherein the erase-gate contact vias for each of the pairs are respectively on opposite sides of a corresponding one of the discontinuities and are along opposing sidewalls of the erase gate at the corresponding one of the discontinuities. In some embodiments, the method further includes: forming an interconnect structure over the word line and the control gate, wherein the interconnect structure includes a word-line strap line elongated in parallel with the word line and electrically coupled to the word line through the word-line contact vias; depositing an IMD layer over the interconnect structure; patterning the IMD layer to form a trench elongated in parallel with the control gate; and filling the trench with a conductive material to form a control-gate strap line electrically coupled to the control gate through the interconnect structure, wherein the interconnect structure is electrically coupled to the control gate through the control-gate contact vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
    a memory array comprising a plurality of cells in a plurality of rows and a plurality of columns, wherein the plurality of rows comprises a first row;
    an erase gate and a control gate elongated along the first row, wherein the erase and control gates partially define cells of the memory array in the first row;
    an erase-gate strap line elongated along the first row at a first elevation above the memory array, wherein the erase-gate strap line is electrically coupled to the erase gate at a plurality of first locations along the first row; and
    a control-gate strap line elongated along the first row at a second elevation above the memory array that is different than the first elevation, wherein the control-gate strap line is electrically coupled to the control gate at a plurality of second locations along the first row.

2. The integrated chip according to claim 1, wherein the first elevation is greater than the second elevation.

3. The integrated chip according to claim 1, wherein the first locations are spaced along the first row and have a first pitch, and wherein the second locations are spaced along the first row and have a second pitch greater than the first pitch.

4. The integrated chip according to claim 1, further comprising:
    a substrate comprising a source line, wherein the source line is elongated along the first row and partially defines the cells of the memory array in the first row; and
    a source-line strap line elongated along the first row at a third elevation above the memory array that is different than the second elevation, and wherein the source-line strap line is electrically coupled to the source line at a plurality of third locations along the first row.

5. The integrated chip according to claim 4, wherein the first locations are spaced along the first row and have a first pitch, and wherein the third locations are spaced along the first row and have the first pitch.

6. The integrated chip according to claim 4, wherein the first and third elevations are the same.

7. The integrated chip according to claim 1, further comprising:
    a word line elongated along the first row and partially defining the cells of the memory array in the first row; and
    a word-line strap line elongated along the first row at a third elevation above the memory array that is different than the first and second elevations, wherein the word-line strap line is electrically coupled to the word line at a plurality of third locations along the first row.

8. The integrated chip according to claim 1, wherein the cells of the memory array in the first row comprise a plurality of first-type strap cells and a plurality of second-type strap cells, wherein the first-type strap cells are spaced along the first row and correspond to the first locations, and wherein the second-type strap cells are spaced along the first row and correspond to the second locations.

9. An integrated chip comprising:
    a substrate;
    a memory array over the substrate and comprising multiple cells in multiple rows and multiple columns, wherein the multiple cells comprise multiple first-type strap cells spaced along a first row of the memory array and a second row of the memory array;

a pair of word lines, a pair of control gates, an erase gate, and a source line elongated in parallel with the first and second rows and partially defining cells of the memory array in the first and second rows, wherein the control gates are between and respectively border the word lines, wherein the erase gate is between and borders the control gates, and wherein the source line underlies the erase gate in the substrate; and a plurality of first contact vias respectively overlying and electrically coupled to the erase gate and the source line, wherein the first contact vias have a first contact-via pattern that repeats along the first and second rows at each of the first-type strap cells.

10. The integrated chip according to claim 9, wherein the first contact-via pattern comprises a pair of erase-gate contact vias and a source-line contact via between and bordering the erase-gate contact vias, wherein the erase-gate contact vias are on the erase gate, and wherein the source-line contact via is on the source line.

11. The integrated chip according to claim 9, wherein the multiple first-type strap cells repeat along the first and second rows with a first frequency, wherein the multiple cells comprise multiple second-type strap cells spaced along the first and second rows and repeating along the first and second rows with a second frequency less than the first frequency, and wherein the first-type and second-type strap cells have different top layouts.

12. The integrated chip according to claim 9, further comprising:
an erase-gate shunt wire and a source-line shunt wire elongated along a first column of the memory array and electrically coupled to cells of the memory array in the first column, wherein the plurality of first contact vias comprises an erase-gate contact via and a source-line contact via, and wherein the erase-gate and source-line contact vias are at the first column and extend respectively from the erase-gate and source-line shunt wires respectively to the erase gate and the source line.

13. The integrated chip according to claim 12, wherein the erase-gate shunt wire wraps around an end of the source-line shunt wire from a first side of the source-line shunt wire to a second side of the source-line shunt wire opposite the first side.

14. The integrated chip according to claim 9, further comprising:
an erase-gate strap line and a source-line strap line elongated along the first row and elevated above the memory array at a common elevation, wherein the erase-gate strap line and the source-line strap line are electrically coupled respectively to the erase gate and the source line respectively through the first contact vias.

15. The integrated chip according to claim 9, wherein the multiple cells comprise multiple second-type strap cells spaced along the first and second rows, and wherein the integrated chip further comprises:
a plurality of second contact vias respectively overlying and electrically coupled to the word lines, wherein the second contact vias have a second contact-via pattern different than the first contact-via pattern that overlies the word lines and that repeats along the first and second rows at each of the second-type strap cells.

16. An integrated chip comprising:
a memory array comprising multiple cells in multiple rows and multiple columns, wherein the cells comprise multiple first-type strap cells spaced along a first row of the memory array and further comprise multiple second-type strap cells spaced along the first row;

a word line and an erase gate extending along the first row and partially defining cells of the memory array in the first row;

a erase-gate strap line extending along the first row at a first elevation above the memory array and electrically coupled to the erase gate at the first-type strap cells; and a word-line strap line extending along the first row at a second elevation above the memory array and electrically coupled to the word line at the second-type strap cells.

17. The integrated chip according to claim 16, wherein the erase-gate strap line is electrically coupled to the erase gate at the first-type strap cells, but not the second-type strap cells, and wherein the word-line strap line is electrically coupled to the word line at the second-type strap cells, but not the first-type strap cells.

18. The integrated chip according to claim 16, wherein the first elevation exceeds the second elevation.

19. The integrated chip according to claim 16, wherein the erase-gate strap line electrically couples to the erase gate at multiple first locations spaced along the first row, wherein the word-line strap line electrically couples to the word line at multiple second locations spaced along the first row, and wherein a pitch of the first locations is less than that of the second locations.

20. The integrated chip according to claim 16, further comprising:
an erase-gate shunt wire elevated above the memory array and elongated along a first column of the memory array, wherein the erase-gate shunt wire has an inverted U-shaped top layout, and wherein the erase-gate strap wire is elevated above the erase-gate shunt wire and is electrically coupled to the erase gate at an intersection of the first row and the first column through the erase-gate shunt wire.

* * * * *